(12) United States Patent
Chung et al.

(10) Patent No.: US 8,324,673 B2
(45) Date of Patent: Dec. 4, 2012

(54) SEMICONDUCTOR MEMORY DEVICES AND METHODS OF FORMING THE SAME

(75) Inventors: Hyun-Woo Chung, Seoul (KR); Kang-Uk Kim, Seoul (KR); Yongchul Oh, Suwon-si (KR); Hui-Jung Kim, Seongnam-si (KR); Hyun-Gi Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 48 days.

(21) Appl. No.: 12/916,998

(22) Filed: Nov. 1, 2010

(65) Prior Publication Data
US 2011/0156119 A1 Jun. 30, 2011

(30) Foreign Application Priority Data
Dec. 31, 2009 (KR) .......................... 10-2009-0135332

(51) Int. Cl.
*H01L 27/108* (2006.01)
(52) U.S. Cl. ............ 257/296; 257/68; 257/71; 257/304; 257/379; 257/E27.084
(58) Field of Classification Search ............... 257/68, 257/71, 296, 304, 379
See application file for complete search history.

(56) References Cited

U.S. PATENT DOCUMENTS

| 2008/0283907 A1 | 11/2008 | Takaishi | |
|---|---|---|---|
| 2009/0096001 A1* | 4/2009 | Ludwig et al. | 257/303 |
| 2009/0256181 A1* | 10/2009 | Forbes | 257/296 |
| 2011/0079836 A1* | 4/2011 | Lin | 257/306 |

FOREIGN PATENT DOCUMENTS

| JP | 2008-288391 A | 11/2008 |
|---|---|---|
| KR | 10-0898582 A | 3/2009 |
| KR | 10-2009-0053108 A | 5/2009 |

* cited by examiner

*Primary Examiner* — Wai Sing Louie
(74) *Attorney, Agent, or Firm* — Harness, Dickey & Pierce, P.L.C.

(57) ABSTRACT

Semiconductor memory devices and methods of forming the same are provided, the semiconductor memory devices include a first and a second buried gate respectively disposed on both inner sidewalls of a groove formed in an active portion and a device isolation pattern. The first and second buried gates are controlled independently from each other.

13 Claims, 33 Drawing Sheets

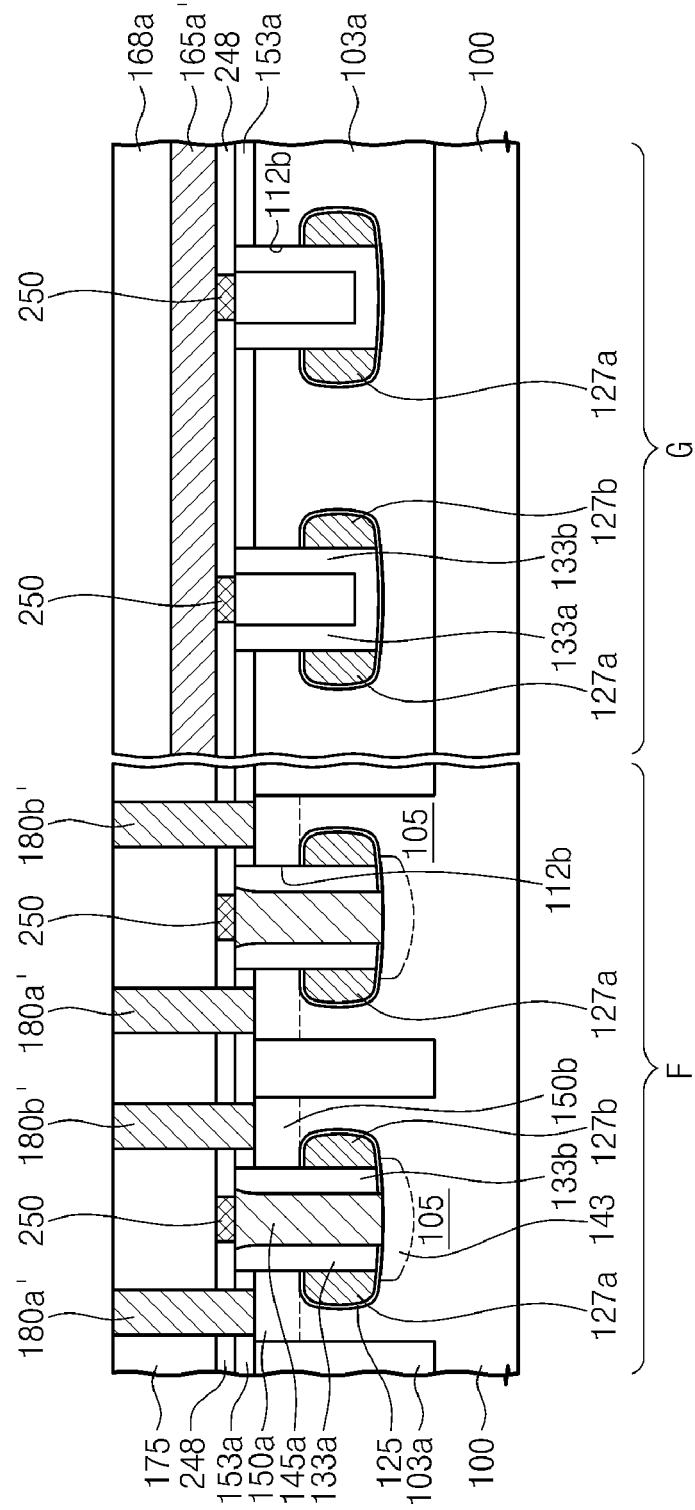

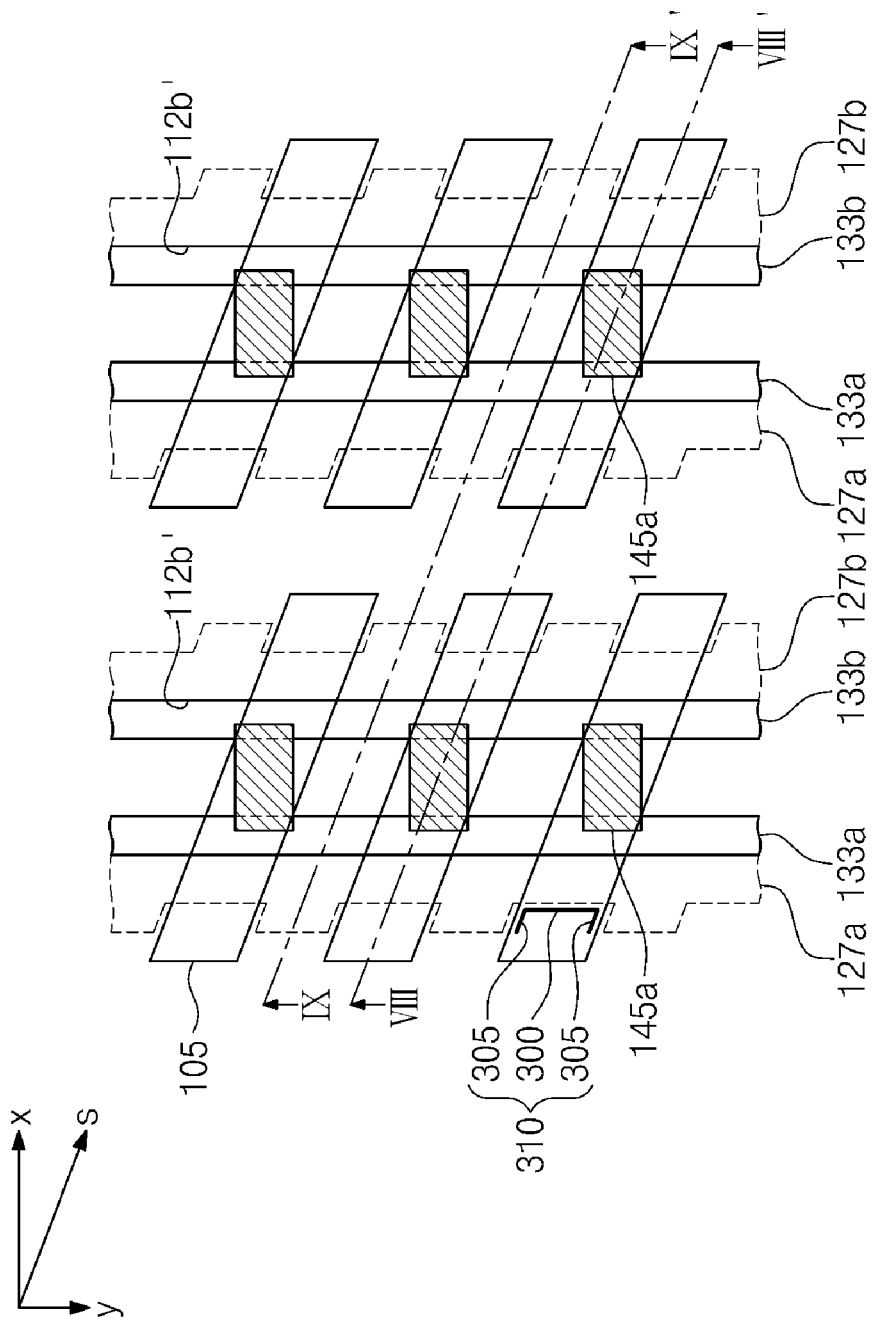

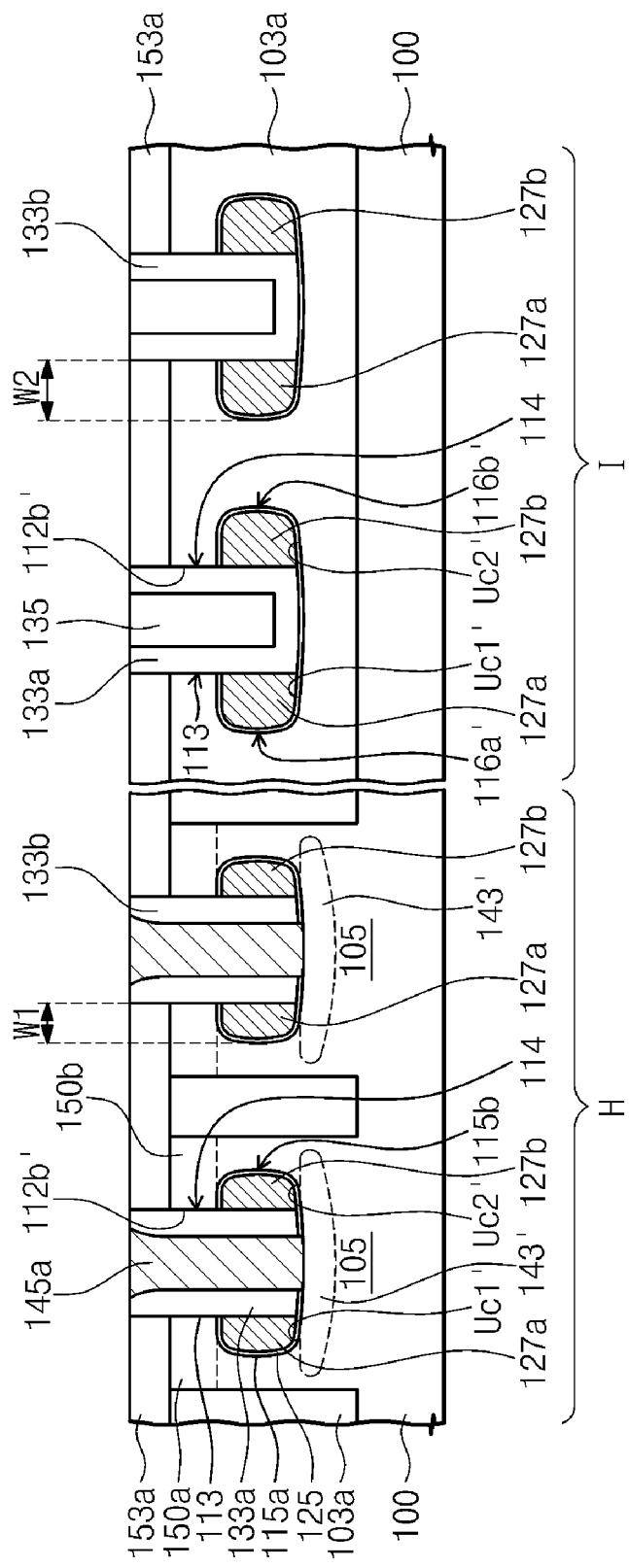

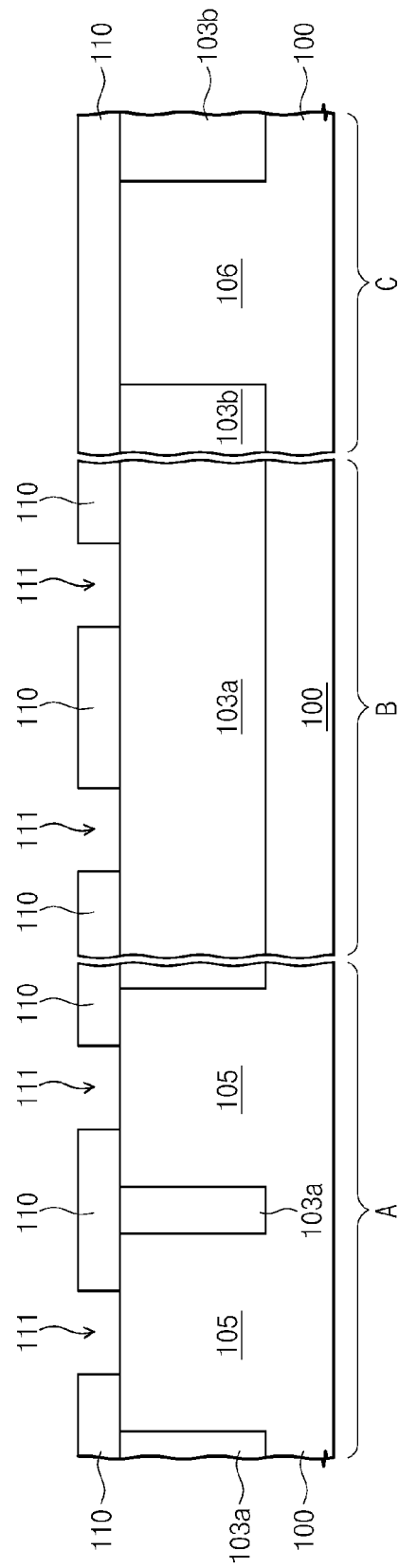

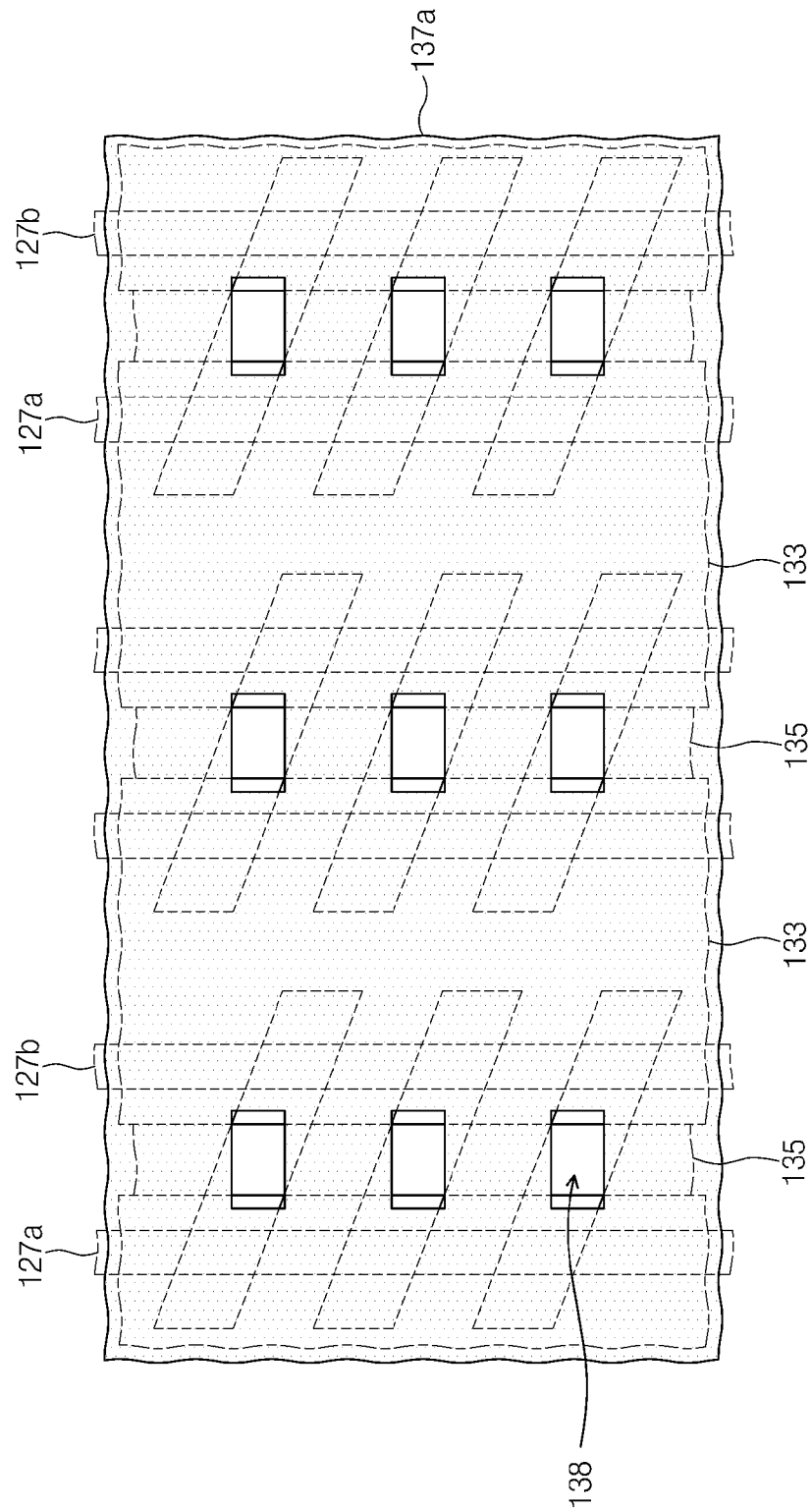

SEMICONDUCTOR MEMORY DEVICES AND METHODS OF FORMING THE SAME

CROSS-REFERENCE TO RELATED APPLICATIONS

This U.S. non-provisional patent application claims priority under 35 U.S.C. §119 of Korean Patent Application 10-2009-0135332, filed on Dec. 31, 2009, the entire contents of which are hereby incorporated by reference.

BACKGROUND

1. Field

Example embodiments herein relate to semiconductor devices and methods of forming the same, and more particularly, to semiconductor memory devices and methods of forming the same.

2. Related Art

Semiconductor devices are generally recognized as important devices in the electronic industry, because semiconductor devices have characteristics such as multi-functions and/or low manufacturing costs. Semiconductor memory devices are semiconductor devices capable of storing logic data and reading stored data. Semiconductor memory devices can broadly be classified as volatile memory devices or non-volatile memory devices. A volatile memory device retains no stored data when power supply is stopped. A DRAM device and an SRAM device are representative volatile memory devices. On the contrary, a non-volatile memory device retains stored data even when power supply is stopped. A flash memory device is a representative non-volatile memory device.

With the increasing developments in the electronic industry, semiconductor memory devices are required to have a larger capacity. Therefore, the semiconductor memory devices have a tendency to be more highly-integrated. Due to various problems, however, it is difficult to realize highly-integrated semiconductor memory devices. For example, a photolithography process for defining minute patterns has limits. Because it is difficult to reduce the occupied area of the minute patterns, the ability to realize more highly-integrated semiconductor devices is restricted. In order to solve these problems, more studies are being carried out to realize highly-integrated semiconductor memory devices.

SUMMARY

Example embodiments herein relate to semiconductor devices and methods of forming the same, and more particularly, to semiconductor memory devices and methods of forming the same.

Example embodiments provide a semiconductor memory device optimized for integration and methods of forming the same.

Example embodiments provide a semiconductor memory device having high reliability and methods of forming the same.

An example embodiment of the inventive concepts provides a semiconductor memory device may include a device isolation pattern formed in a substrate to define an active portion extending in a first direction; and first and second buried gates respectively disposed on first and second inner sidewalls of a groove being formed in the active portion and the device isolation pattern. The groove extends in a second direction non-parallel to a first direction, and the first and second buried gates are controlled independently from each other. The device further includes gate dielectric films respectively interposed between the first buried gate and the first inner sidewall of the groove and between the second buried gate and the second inner sidewall of the groove; first and second doped regions respectively formed in upper portions of the active portion on both sides of the groove; and a common doped region formed in the active portion below a bottom surface of the groove.

In some example embodiments, the first buried gate may be disposed on a lower sidewall of the first inner sidewall, and the second buried gate may be disposed on a lower sidewall of the second inner sidewall.

In other example embodiments, the lower sidewall of the first inner sidewall may be recessed laterally with respect to an upper sidewall of the first inner sidewall to define a first undercut region. The lower sidewall of the second inner sidewall may be recessed laterally with respect to an upper sidewall of the second inner sidewall to define a second undercut region. The first buried gate may be disposed in the first undercut region. The second buried gate may be disposed in the second undercut region.

In still other example embodiments, the lower sidewall of the first inner sidewall may include a first active lower sidewall formed by the active portion and a first non-active lower sidewall formed by the device isolation pattern. The first non-active lower sidewall may be recessed more laterally than the first active lower sidewall, such that a first channel region controlled by the first buried gate may include a first portion extending in the first direction and a second portion extending in the second direction. The lower sidewall of the second inner sidewall may include a second active lower sidewall formed by the active portion and a second non-active lower sidewall formed by the device isolation pattern. The second non-active lower sidewall may be recessed more laterally than the second active lower sidewall, such that a second channel region controlled by the second buried gate may include a first portion extending in the first direction and a second portion extending in the second direction.

In even other example embodiments, the first buried gate may have a sidewall that is self-aligned on the upper sidewall of the first inner sidewall.

In yet other example embodiments, the first buried gate may have first and second sidewalls opposite to each other, the first sidewall of the first buried gate may be adjacent to the lower sidewall of the first inner sidewall, and the second sidewall of the first buried gate may be recessed more laterally than the upper sidewall of the first inner sidewall. The second buried gate may have first and second sidewalls opposite to each other, the first sidewall of the second buried gate may be adjacent to the lower sidewall of the second inner sidewall, and the second sidewall of the second buried gate may be recessed more laterally than the upper sidewall of the second inner sidewall.

In further example embodiments, the semiconductor memory device may further include a first data storing element electrically connected to the first doped region; a second data storing element electrically connected to the second doped region; and a common wiring electrically connected to the common doped region.

In still further example embodiments, the semiconductor memory device may further include a common pillar disposed in the groove and connected to the common doped region; a first insulating spacer interposed between the common pillar and the first buried gate; and a second insulating spacer interposed between the common pillar and the second buried gate. The common wiring may electrically be connected to an upper surface of the common pillar.

In even further example embodiments, the first data storing element may be a first capacitor including a first storage electrode electrically connected to the first doped region. The second data storing element may be a second capacitor including a second storage electrode electrically connected to the second doped region. The common wiring may be a bit line crossing over the first and second buried gates.

In yet further example embodiments, the first data storing element may include a first variable resistor capable of changing to a plurality of stable states with resistivities different from each other, and the second data storing element may include a second variable resistor capable of changing to a plurality of stable states with resistivities different from each other.

In other example embodiments, the second direction may be not perpendicular to the first direction.

In still other example embodiments, the second direction may be perpendicular to the first direction.

In even other example embodiments, the substrate may include a cell array region and a peripheral circuit region and the active portion and the first and second buried gates may be disposed in the cell array region. The semiconductor memory device may further include a peripheral device isolation pattern disposed in the substrate in the peripheral circuit region to define a peripheral active portion; a peripheral gate crossing over the peripheral active portion; and a peripheral gate dielectric film interposed between an upper surface of the peripheral active portion and the peripheral gate. The common wiring may be formed of the same material as an upper portion of the peripheral gate.

According to another example embodiment of the inventive concepts, there is provided a semiconductor memory device including a substrate having a device isolation pattern and an active portion delimited by the device isolation pattern. A groove is formed in the active portion and the device isolation pattern. The active region extends in a first direction and the groove extends a second direction that intersects the first direction. The device further includes a common doped region in the active portion and below the groove, first and second buried gates disposed on opposing sidewalls of the groove, gate dielectric films respectively enclosing the first and second buried gates, and first and second doped regions in the active portion and above a portion of the groove. The first doped region is disposed over the first buried gate, and the second doped region is disposed over the second buried gate.

In example embodiments, the semiconductor memory device further includes a first channel region above the first buried gate, and a second channel region above the second buried gate. The first channel region extends along the first direction to an outermost sidewall of the first buried gate, and along the second direction in the active portion. The second channel region extends along the first direction to an outer most sidewall of the second buried gate, and along the second direction in the active portion.

In yet other example embodiments, the semiconductor memory device further includes a common pillar in the groove interposed between the first and second buried gates and connected to the common doped region, a first insulating spacer interposed between the common pillar and the first buried gate, and a second insulating spacer interposed between the common pillar and the second buried gate.

A first data storing element may be electrically connected to the first doped region, a second data storing element may be electrically connected to the second doped region, and a common wiring may be electrically connected to the common doped region. The common wiring may be electrically connected to an upper surface of the common pillar.

The first buried gate is formed on an outer most sidewall of the first insulating spacer to define a first undercut region extending laterally from the first insulating spacer. The second buried gate is formed on an outermost sidewall of the second insulating spacer to define a second undercut region extending laterally from the second insulating spacer. The first buried gate is disposed in the first undercut region, and the second buried gate is disposed in the second undercut region.

The outermost sidewall of the first insulating spacer includes an upper portion and a lower portion extending laterally beyond the upper portion toward the first buried gate. The outermost sidewall of the second insulating spacer includes an upper portion and a lower portion extending laterally beyond the upper portion toward the second buried gate. The outer most sidewall of the first insulating spacer includes a lower portion and an upper portion extending laterally beyond the lower portion. The outermost sidewall of the second insulating spacer includes a lower portion and an upper portion extending laterally beyond the lower portion.

In yet another example embodiment of the inventive concepts, a method of forming a semiconductor memory device may include forming a device isolation pattern in a substrate to define an active portion extending in a first direction; and forming a groove in the active portion and the device isolation pattern. The groove extends in a second direction being non-parallel to the first direction. The method further includes forming gate dielectric films on first and second inner sidewalls of the groove; forming first and second buried gates on the first and second inner sidewalls of the groove, respectively; forming a common doped region in the active region below a bottom surface of the groove; and forming first and second doped regions in the active region on both sides of the groove. The first and second buried gates may be controlled independently from each other.

In some example embodiments, the forming of the groove may include forming a hard mask film on the active portion and the device isolation pattern, the hard mask film having an opening extending in the second direction; and anisotropic etching the active portion and the device isolation pattern below the opening.

In other example embodiments, a first preliminary groove may be formed by the anisotropic etching. The forming of the groove may further include forming etching protection spacers on both inner sidewalls of the first preliminary groove, respectively; forming a second preliminary groove by anisotropic etching the active portion and the device isolation pattern below the first preliminary groove using the hard mask film and the etching protection spacers as etching masks; and forming the groove with first and second undercut regions by laterally recessing both lower sidewalls of the second preliminary groove located below the etching protection spacers. The first buried gate may be formed in the first undercut region be disposed on the recessed lower sidewall of the first inner sidewall of the groove. The second buried gate may be formed in the second undercut region to be disposed on the recessed lower sidewall of the second inner sidewall of the groove.

In still other example embodiments, each of the both lower sidewalls of the second preliminary groove may include a first portion formed by the second active portion and a second portion formed by the device isolation pattern. The forming of the groove with the first and second undercut regions may further include laterally recessing the first portions of the both lower sidewalls of the second preliminary groove; and laterally recessing the second portions of the both lower sidewalls of the second preliminary groove.

In even other example embodiments, the second portions of the both lower sidewalls of the second preliminary groove may be recessed more laterally than the first portions of the both sidewalls of the second preliminary groove.

In yet other example embodiments, the method may further include forming first and second insulating spacers over the first and second inner sidewalls of the groove so as to cover the first and second buried gates, respectively; and forming a common pillar between the first and second insulating spacers so as to be connected to the common doped region.

In further example embodiments, the method may further include forming a common wiring connected to an upper surface of the common pillar; and forming a first data storing element electrically connected to the first doped region and a second data storing element electrically connected to the second doped region.

BRIEF DESCRIPTION OF THE DRAWINGS

The accompanying drawings are included to provide a further understanding of example embodiments of the inventive concepts, and are incorporated in and constitute a part of this specification. The drawings illustrate example embodiments of the inventive concepts and, together with the description, serve to explain principles of the inventive concept. In the drawings:

FIG. 6B is a cross-sectional view taken along the line VI-VI' and VII-VII' of FIG. 6A;

FIG. 7A is a plan view illustrating a semiconductor memory device according to still another modified example of the example embodiment of the inventive concepts;

FIG. 7B a cross-sectional view taken along the line VIII-VIII' and IX-IX' of FIG. 7A;

FIGS. 8 through 24 are cross-sectional views illustrating the semiconductor memory device taken along the lines I-I', II-II', and III-III' of FIG. 1 according to an example embodiment of the inventive concepts;

FIG. 25B is a plan view illustrating a mask pattern illustrated in FIG. 14 according to a modified example;

DETAILED DESCRIPTION OF THE EXAMPLE EMBODIMENTS

Figure 1:
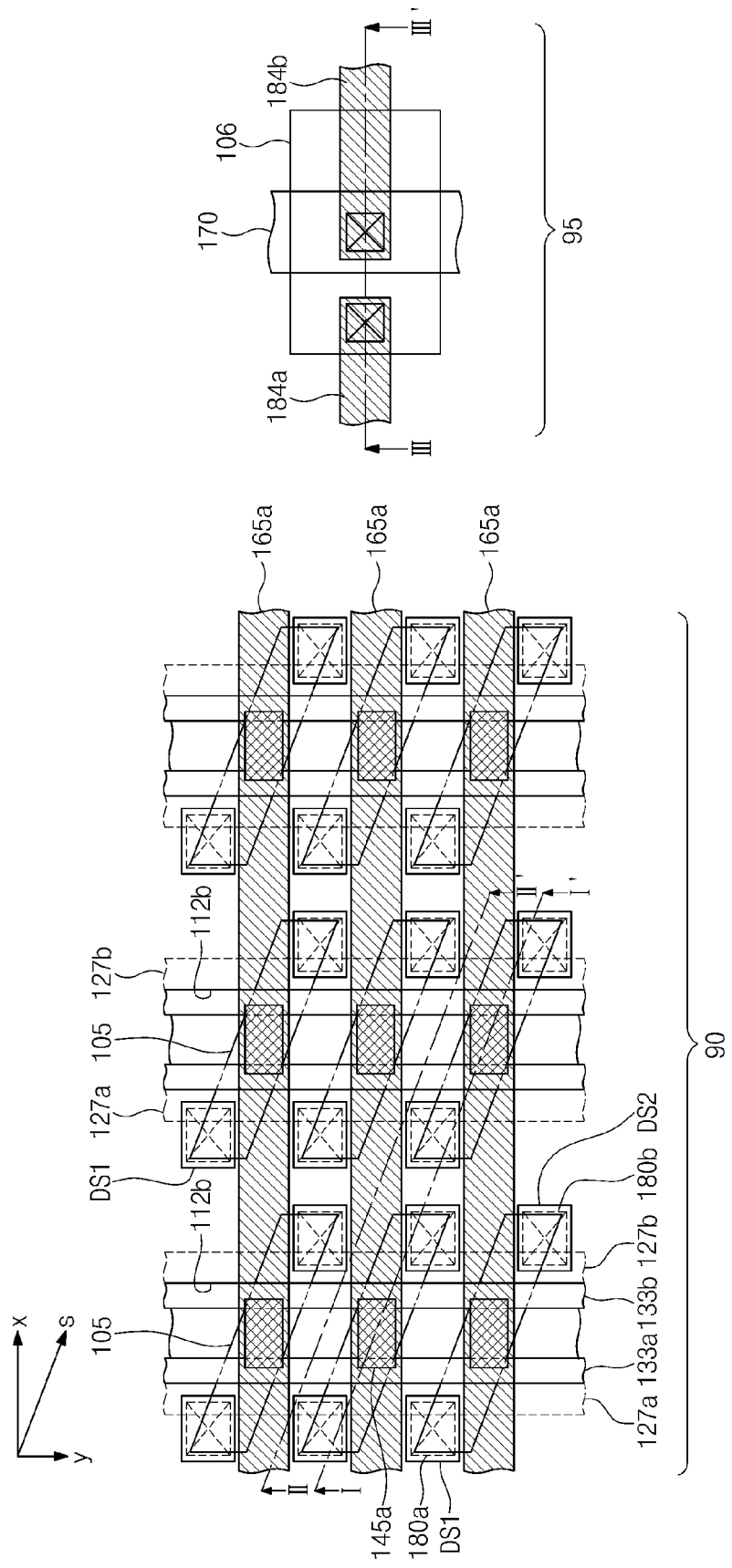
FIG. 1 is a plan view illustrating a semiconductor memory device according to an example embodiment of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments herein relate to semiconductor devices and methods of forming the same, and more particularly, to semiconductor memory devices and methods of forming the same.

Figure 2A:
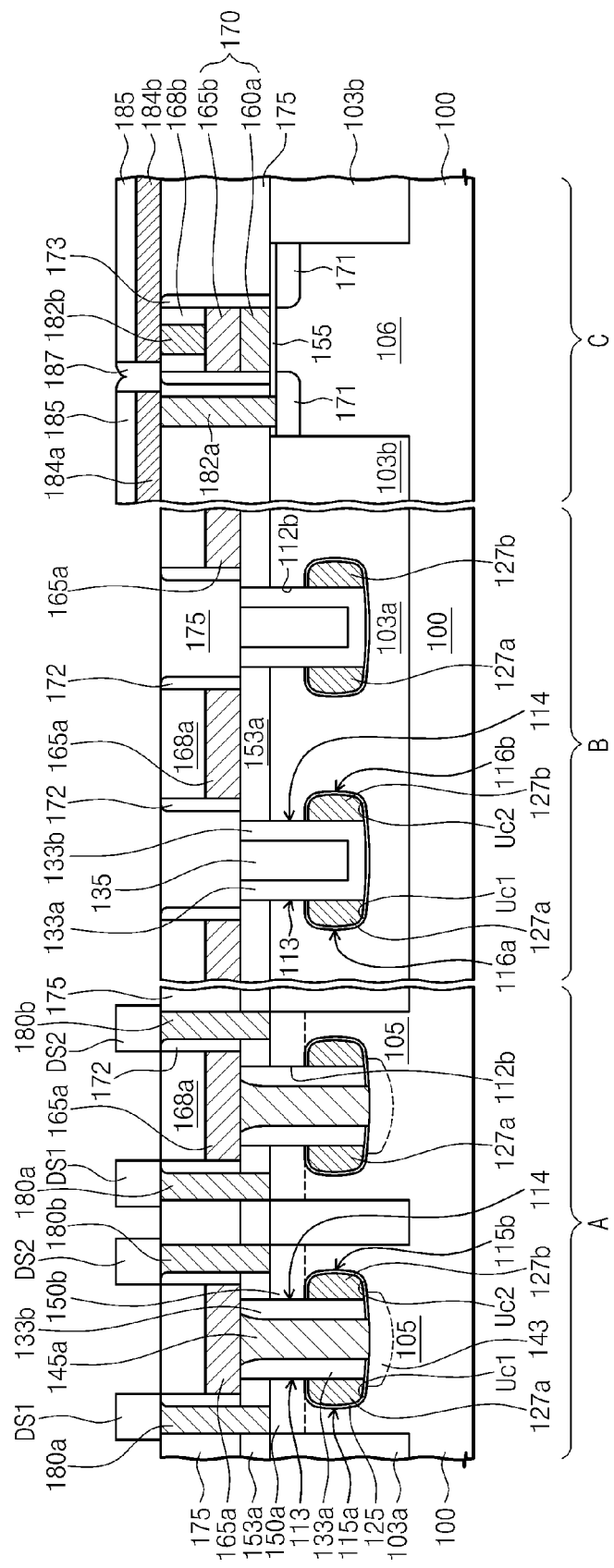
FIG. 2A is a cross-sectional view taken along the lines I-I', II-II', and III-III' of FIG. 1.

FIG. 1 is a plan view illustrating a semiconductor memory device according to an example embodiment of the inventive concepts. FIG. 2A is a cross-sectional view taken along the lines I-I', II-II', and III-III' of FIG. 1.

In FIG. 2A, reference sign A denotes the cross-sectional view taken along the line I-I' of FIG. 1, reference sign B denotes the cross-sectional view taken along the line II-II' of FIG. 1, and reference sign C denotes the cross-sectional view taken along the line III-III' of FIG. 1.

Referring to FIGS. 1 and 2A, a semiconductor substrate 100 (hereinafter, referred to as a substrate) may include a cell array region 90 and a peripheral circuit region 95. The substrate 100 may be a silicon substrate, a germanium substrate, or a silicon-germanium substrate. A cell device isolation pattern 103a may be disposed in the substrate 100 in the cell array region 90, a peripheral device isolation pattern 103b may be disposed in the substrate 100 in the peripheral circuit region 95. The cell device isolation pattern 103a may define a plurality of cell active portions 105 on the substrate 100 of the cell array region 90 of the substrate 100. The peripheral device isolation pattern 103b may define a peripheral active portion 106 on the substrate 100 in the peripheral circuit region 95. The cell active portion 105 may correspond to a part of the substrate 100 surrounded by the cell device isolation pattern 103a. The peripheral active portion 106 may correspond to a part of the substrate 100 surrounded by the peripheral device isolation pattern 103b.

The cell device isolation pattern 103a may be formed of oxide and/or nitride. The peripheral device isolation pattern 103b may be formed of oxide and/or nitride. The cell device isolation pattern 103a may be multi-layered, and the peripheral device isolation pattern 103b may be multi-layered. A width of the peripheral device isolation pattern 103b may be larger than that of the cell device isolation pattern 103a. Therefore, the number of layers in the cell device isolation pattern 103a may be smaller than that of layers in the peripheral device isolation pattern 103b.

As illustrated in FIG. 1, the plurality of cell active portions 105 may be arranged two-dimensionally along a plurality of rows and a plurality of columns. Each cell active portion 105 may extend in a first direction (e.g., along the "s" direction). Each cell active portion 105 may have a rectangular shape extending in the first direction. The first direction is parallel to the upper surface of the substrate 100. A groove 112b may be formed in the cell active portion 105 and the cell device isolation pattern 103a. The groove 112b may intersect the cell active portion 105. The groove 112b extends in a second direction (e.g., along the y-axis) being non-parallel to the first direction. The second direction may be also parallel to the upper surface of the substrate 100. The second direction may correspond to the y-axis direction of FIG. 1. The second direction may be not perpendicular to the first direction. The first direction corresponds to an "s" direction illustrated in FIG. 1. The groove 112b may extend in the second direction to intersect a plurality of cell active portions 105 constituting one column. That is, the groove 112b may be formed in the plurality of cell active portions 105, which collectively constitute the one column, and the cell device isolation pattern 103a. A plurality of the grooves 112b may be formed in the cell array region 90. The plurality of grooves 112b may correspond to the plurality of columns, respectively.

Each groove 112b may have a first inner sidewall and a second inner sidewall facing each other, and a bottom surface. A first buried gate 127a and a second buried gate 127b may be disposed in each groove 112b. The first buried gate 127a is disposed on the first inner sidewall of the groove 112b. The second buried gate 127b is disposed on the second inner sidewall of the groove 112b. A gate dielectric film 125 may be interposed between the first buried gate 127a and the first inner sidewall of the groove 112b and between the second buried gate 127b and the second inner sidewall of the groove 112b. It is preferable that the first buried gate 127a and the second buried gate 127b are controlled independently from each other.

The first buried gate 127a and the second buried gate 127b may be formed of a conductive material. For example, the first buried gate 127a and the second buried gate 127b may include at least one of a doped semiconductor material (for example, doped silicon or doped germanium), a conductive metal nitride (for example, titanium nitride or tantalum nitride), a metal (for example, tungsten, titanium, or tantalum), or a metal-semiconductor compound (for example, tungsten silicide, cobalt silicide, or titanium silicide), etc. The gate dielectric film 125 may be for of oxide, nitride, and/or oxynitride.

The first inner sidewall of the groove 112b may include an upper portion 113 and a lower portion (115a and 116a). The upper portion 113 of the first inner sidewall is referred to as an upper sidewall of the first inner sidewall. The lower portion (115a and 116a) of the first inner sidewall is referred to as a lower sidewall of the first inner sidewall. Likewise, an upper portion 114 of the second inner sidewall of the groove 112b is referred to as an upper sidewall of the second inner sidewall. A lower portion (115b and 116b) of the second inner sidewall is referred to as a lower sidewall of the second inner sidewall. The upper sidewall 113 of the first inner sidewall may include a portion formed by the cell active portion 105 and a portion formed by the cell device isolation pattern 103a. The lower sidewall (115a and 116a) of the first inner sidewall may also include a portion 115a formed by the cell active portion 105 and a portion 116a formed by the cell device isolation pattern 103a. The portion 115a of the lower sidewall of the first inner sidewall is referred to as a first active lower sidewall 115a. The portion 116a of the lower sidewall of the first inner sidewall is referred to as a first non-active lower sidewall 116a. Likewise, the upper sidewall 114 of the second inner sidewall may include a portion formed by the cell active portion 105 and a portion formed by the cell device isolation pattern 103a. The lower sidewall (115b and 116b) of the second inner sidewall may include a portion 115b formed by the cell active portion 105 and a portion 116b formed by the cell device isolation pattern 103a. The portion 115b of the lower sidewall of the second inner sidewall is referred to as a second active lower sidewall 115b. The portion 116b of the lower sidewall of the second inner sidewall is referred to as a second non-active lower sidewall 116b.

The uppermost ends of the first buried gate 127a and the second buried gate 127b may be lower than the uppermost surface of the cell active portion 105. The first buried gate 127a may be disposed on the lower sidewall (115a and 116a) of the first inner sidewall of the groove 112b. The second buried gate 127b may be disposed on the lower sidewall (115b and 116b) of the second inner sidewall of the groove 112b. The lower sidewall (115a and 116a) of the first inner sidewall may be recessed more laterally than the upper sidewall 113 of the first inner sidewall. Thus, a first undercut region Uc1 may be defined. Likewise, the lower sidewall (115b and 116b) of the second inner sidewall may be recessed more laterally than the upper sidewall 114 of the second inner sidewall. Thus, a second undercut region Uc2 may be defined. The first inner sidewall and the second inner sidewall of the groove 112b may be symmetrical with reference to the bottom surface of the groove 112b. The first buried gate 127a may be disposed in the first undercut region Uc1, such that the first buried gate 127a may be disposed on the lower sidewall (115a and 116a) of the first inner sidewall. The second buried gate 127b may be disposed in the second undercut region Uc2, such that the second buried gate 127b may be disposed on the lower sidewall (115b and 116b) of the second inner sidewall. Therefore, the first buried gate 127a and the second buried gate 127b may extend parallel in the second direction. The first buried gate 127a may pass through the plurality of cell active portions 105 constituting one column. Likewise, the second buried gate 127b may pass through the plurality of cell active portions 105 constituting the one column.

According to an example embodiment of the inventive concepts, the laterally recessed depth of the first active lower sidewall 115a from the upper sidewall 113 of the first inner sidewall may be substantially the same as the laterally recessed depth of the first non-active lower sidewall 116a. Therefore, the first buried gate 127a may have a substantially uniform width. Likewise, the laterally recessed depth of the second active lower sidewall 115b from the upper sidewall 114 of the second inner sidewall may be substantially the same as the laterally recessed depth of the second non-active lower sidewall 116b. Therefore, the second buried gate 127b may also have a substantially uniform width. The first buried gate 127a and the second buried gate 127b may be symmetrical to each other.

A common doped region 143 may be disposed in the cell active portion 105 below the bottom surface of the groove 112b. A first doped region 150a and a second doped region 150b may be respectively disposed in the cell active portion 105 on both sides of the groove 112b. The first doped region 150a and the second doped region 150b may be substantially disposed in parts of the cell active portion 105 above the undercut regions Uc1 and Uc2, respectively. The cell active portion 105 is doped with a first conductive dopant and the doped regions 143, 150a, and 150b are doped with a second conductive dopant. For example, the cell active portion 105 may be doped with a p-type dopant and the doped regions 143, 150a, and 150b may be doped with an n-type dopant. Alternatively, the cell active portion 105 may be doped with an n-type dopant and the doped regions 143, 150a, and 150b may be doped with a p-type dopant.

The first buried gate 127a may control a vertical channel region defined at the first active lower sidewall 115a and the second buried gate 127b may control a vertical channel region defined at the second active lower sidewall 115b. The first buried gate 127a, the first doped region 150a, and the common doped region 143 may be included in a first field-effect transistor. The second buried gate 127b, the second doped region 150b, and the common doped region 143 may be included in a second field-effect transistor. The first and second field-effect transistors share the common doped region 143.

The first buried gate 127a may have a first and a second sidewall opposite to each other. The first sidewall of the first buried gate 127a is adjacent to the lower sidewall (115a and 116a) of the first inner sidewall. As illustrated in FIG. 2A, the second sidewall of the first buried gate 127a may be self-aligned with the upper sidewall 113 of the first inner sidewall. Likewise, the second buried gate 127b may have a first and a second sidewall opposite to each other. The first sidewall of the second buried gate 127b is adjacent to the lower sidewall (115b and 116b) of the second inner sidewall. The second sidewall of the second buried gate 127b may be self-aligned with the upper sidewall 114 of the second inner sidewall.

A common pillar 145a may be disposed in the groove 112b to be connected to the common doped region 143. A first insulating spacer 133a may be disposed between the common pillar 145a and the first buried gate 127a. The first insulating spacer 133a may extend upward to be interposed between the upper sidewall 113 of the first inner sidewall and the common pillar 145a. A second insulating spacer 133b may be interposed between the common pillar 145a and the second buried gate 127b. The second insulating spacer 133b may extend upward to be interposed between the common pillar 145a and the upper sidewall 114 of the second inner sidewall. The first insulating spacer 133a and the second insulating spacer 133b may extend parallel with each other in the second direction. A plurality of the common pillars 145a may be disposed in the cell array region 90 and arranged two-dimensionally along the rows and columns. Each of common pillars 145a may be connected to each of the common doped regions 143 formed in the plurality of cell active portions 105. The common pillars 145a are spaced from each other.

A plurality of common pillars 145a constituting one column may be disposed in each of the grooves 112b and spaced from each other in the second direction. A filling dielectric pattern 135 may fill parts of the groove 112b located in the cell device isolation pattern 103a. In other words, the filling dielectric pattern 135 may fill the parts of the groove 112b between the plural common pillars 145a constituting one column. As illustrated in region B of FIG. 2A, lower ends of portions of the first insulating spacer 133a and the second insulating spacer 133b may extend to be connected to each other. The connected extensions of the portions of the first insulating spacer 133a and the second insulating spacer 133b may be located below the filling dielectric pattern 135.

The common pillar 145a may have a protrusion portion protruding more upward than the uppermost surface of the cell active portion 105. The first insulating spacer 133a and the second insulting spacer 133b may also have a protrusion portion protruding more upward than the uppermost surface of the cell active portion 105. The protrusion portions of the first insulating spacer 133a and the second insulting spacer 133b may come into contact with both sidewalls of the protrusion portion of the common pillar 145a, respectively. The filling dielectric pattern 135 may also have a protrusion portion protruding more upward than the uppermost surface of the cell active portion 105. The upper surfaces of the protrusion portions of the common pillar 145a, the insulating spacers 133a and 133b, and the filling dielectric pattern 135 may be coplanar with each other.

The common pillar 145a may be formed of a conductive material. For example, the common pillar 145a may include at least one of a doped semiconductor material (for example, doped silicon or doped germanium), a conductive metal nitride (for example, titanium nitride or tantalum nitride), a metal (for example, tungsten, titanium, or tantalum), or a metal-semiconductor compound (for example, tungsten silicide, cobalt silicide, or titanium silicide), etc. For example, the first insulating spacer 133a and the second insulating spacer 133b may be formed of oxide, nitride, and/or oxynitride. The filling dielectric pattern 135 may be formed of a dielectric material having etching selectivity to the first and second insulating spacers 133a and 133b. For example, when the first and second insulating spacers 133a and 133b may be formed of nitride and/or oxynitride, the filling dielectric pattern 135 may be formed of oxide. Alternatively, when the first and second insulating spacers 133a and 133b may be formed of oxide or the like, the filling dielectric pattern 135 may be formed of nitride and/or oxynitride.

A capping dielectric film 153a may be formed in the cell array region 90. The capping dielectric film 153a may be disposed on the cell active portion 105 and the cell device isolation pattern 103a. The capping dielectric film 153a may have a planarized upper surface that is coplanar with the upper surfaces of the common pillars 145a, the insulating spacers 133a and 133b, and the filling dielectric film 135. The capping dielectric film 153a may be formed of a dielectric material having etching selectivity to the filling dielectric film 135. The capping dielectric film 153a may be formed of the same material as that of the insulating spacers 133a and 133b.

A common wiring 165a may be disposed on the capping dielectric film 153a to be connected to the common pillar 145a. The common wiring 165a may extend in a third direction perpendicular to the second direction. The third direction may correspond to an x-axis direction in FIG. 1. As illustrated in FIG. 1, the common wiring 165a may be connected to the plurality of common pillars 145a constituting each row. A plurality of the common wirings 165a may be formed in the cell array region 90. The plurality of common wirings 165a may correspond to the plurality of rows, respectively. The invention is not limited thereto. According to an example embodiment of the inventive concepts, the plurality of common wirings 165a may extend in another direction. A cell capping mask pattern 168a may be formed on each common wiring 165a. The cell capping mask pattern 168a may have both sidewalls that are self-aligned on both sidewalls of the common wiring 165a.

Referring to FIGS. 1 and 2A, a peripheral gate 170 may be disposed in the peripheral circuit region 95 so as to cross over the peripheral active portion 106. A peripheral gate dielectric film 155 may be interposed between the peripheral gate 170 and the upper surface of the peripheral active portion 106. The peripheral gate 170 may include a lower gate 160a and an upper gate 165b that are sequentially laminated. A peripheral capping mask pattern 168b may be formed on the peripheral gate 170. The peripheral capping mask pattern 168b may have both sidewalls that are self-aligned on both sidewalls of the peripheral gate 170. Peripheral source/drains 171 are disposed in the peripheral active portion 106 on both sides of the peripheral gate 170. The peripheral source/drains 171 may be formed of the same dopant as that of the doped regions 150a and 150b or may be doped with a dopant different from that of the doped regions 150a and 150b.

The lower gate 160a of the peripheral gate 170 may be formed of a conductive material capable of adjusting a work function. For example, the lower gate 160a may be formed of a doped semiconductor material (for example, doped silicon, doped germanium and/or doped silicon-germanium). The upper gate 165b may be formed of a conductive material with resistivity lower than that of the lower gate 160a. For example, the upper gate 165b may include at least one of a metal (for example, tungsten, titanium, or tantalum), a conductive metal nitride (for example, titanium nitride, or tantalum nitride), or a metal-semiconductor compound (for example, tungsten silicide, cobalt silicide, or titanium silicide), etc.

The common wiring 165a of the cell array region 90 may include at least one of a metal (for example, tungsten, titanium, or tantalum), a conductive metal nitride (for example, titanium nitride or tantalum nitride), a metal-semiconductor compound (for example, tungsten silicide, cobalt silicide, or titanium silicide), etc. According to an example embodiment of the inventive concepts, the common wiring 165a may be formed of the same material as that of the upper gate 165b of the peripheral gate 170. According to an example embodiment of the inventive concepts, the common wiring 165a may be formed simultaneously with the upper gate 165b of the peripheral gate 170.

The cell capping mask pattern 168a and the peripheral capping mask pattern 168b may be formed of the same material. For example, the cell capping mask pattern 168a and the peripheral capping mask pattern 168b may be formed of oxide, nitride, and/or oxynitride, but are not limited thereto. The capping mask pattern 168a and the peripheral capping mask pattern 168b may be formed of materials different from each other.

Sidewall spacers 172 may be disposed on both sidewalls of the common wiring 165a and the cell capping mask pattern 168a. Peripheral gate spacers 173 may be disposed on both sidewalls of the peripheral gate 170 and the peripheral capping mask pattern 168b. With such a configuration, the both sidewalls and the upper surface of the common wiring 165a may be surrounded by the sidewall spacer 172 and the cell capping mask pattern 168a, and the both sidewalls and the upper surface of the peripheral gate 170 may be surrounded by the peripheral gate spacer 173 and the peripheral capping mask pattern 168b.

The substrate 100 may be covered with an inter-layer dielectric film 175. The inter-layer dielectric film 175 may have a planarized upper surface that is coplanar with the upper surfaces of the cell capping mask pattern 168a and the peripheral capping mask pattern 168b. However, the invention is not limited thereto. According to an example embodiment of the inventive concepts, the inter-layer dielectric film 175 may cover the upper surfaces of the cell capping mask pattern 168a and the peripheral capping mask pattern 168b.

It is preferable that the sidewall spacer 172 and the peripheral gate spacer 173 are formed of the same dielectric material. The spacers 172 and 173 and the capping mask patterns 168a and 168b may be formed of a dielectric material having etching selectivity to the inter-layer dielectric film 175. For example, when the inter-layer dielectric film 175 is formed of oxide, the spacers 172 and 173 and the capping mask patterns 168a and 168b may be formed of nitride and/or oxynitride.

A first contact plug 180a may sequentially penetrate the inter-layer dielectric film 175 and the capping dielectric film 153a so as to be connected to the first doped region 150a. A second contact plug 180b may sequentially penetrate the inter-layer dielectric film 175 and the capping dielectric film 153a so as to be connected to the second doped region 150b. The first contact plug 180a and the second contact plug 180b may have a sidewall that is self-aligned to the sidewall spacer 172. A plurality of the first contact plugs 180a may be formed in the cell array region 90. That is, the plurality of first contact plugs 180a may be connected to the first doped regions 150a formed in the plurality of cell active portions 105, respectively. Likewise, a plurality of the second contact plugs 180b may be also formed in the cell array region 90. That is, the plurality of second contact plugs 180b may be also connected to the second doped regions 150b formed in the plurality of cell active portions 105, respectively. The first contact plug 180a and the second contact plug 180b may include at least one of a conductive material such as a doped semiconductor material (for example, doped silicon, doped germanium, and/or doped silicon-germanium), a metal (for example, tungsten, titanium, or tantalum), a conductive metal nitride (for example, titanium nitride or tantalum nitride), or a metal-semiconductor compound (for example, tungsten silicide, cobalt silicide, or titanium silicide).

A first data storing element DS1 may be disposed on the inter-layer dielectric film 175 of the cell array region 90 so as to be connected to the first contact plug 180a. Therefore, the first data storing element DS1 may be electrically connected to the first doped region 150a via the first contact plug 180a. A second data storing element DS2 may be disposed on the inter-layer dielectric film 175 of the cell array region 90 so as to be connected to the second contact plug 180b. Therefore, the second data storing element DS2 may be electrically connected to the second doped region 150b via the second contact plug 180b. The first data storing element DS1 and the second data storing element DS2 may be realized in various forms. For example, the first data storing element DS1 and the second data storing element DS2 may be realized as capacitors or variable resistors. The first and second data storing elements DS1 and DS2 will be described in detail below.

First and second memory cells may be disposed at each cell active portion 105. The first memory cell may include the first data storing element DS1 and the first field-effect transistor including the first doped region 150a and the first buried gate 127a. The second memory cell may include the second data storing element DS2 and the second field-effect transistor including the second doped region 150b and the second buried gate 127b. The first field-effect transistor may correspond to a switching component of the first memory cell. The second field-effect transistor may correspond to a switching component of the second memory cell.

A peripheral contact plug 182a may penetrate the inter-layer dielectric film 175 in the peripheral circuit region 95 so as to be connected to the peripheral source/drain 171. A peripheral gate contact plug 182b may penetrate the peripheral capping mask pattern 168b to be connected to the peripheral gate 170. The peripheral contact plug 182a and the peripheral gate contact plug 182b may include at least one of a doped semiconductor material (for example, doped silicon, doped germanium, and/or doped silicon-germanium), a metal (for example, tungsten, titanium, or tantalum), a conductive metal nitride (for example, titanium nitride or tantalum nitride), or a metal-semiconductor compound (for example, tungsten silicide, cobalt silicide, or titanium silicide). According to an example embodiment of the inventive concepts, the first contact plug 180a, the second contact plug 180b, the peripheral contact plug 182a, and the peripheral gate contact plug 182b may be formed of the same conductive material.

A first peripheral wiring 184a may be disposed on the inter-layer dielectric film 175 in the peripheral circuit region 95 so as to be connected to the peripheral contact plug 182a. A second peripheral wiring 184b may be disposed on the inter-layer dielectric film 175 in the peripheral circuit region 95 so as to be connected to the peripheral contact plug 182b. The first peripheral wiring 184a and the second peripheral wiring 184b may include at least one of a metal (for example, tungsten, titanium, or tantalum), a conductive metal nitride (for example, titanium nitride or tantalum nitride), or a metal-semiconductor compound (for example, tungsten silicide, cobalt silicide, or titanium silicide). Both sidewalls and the upper surfaces of the first peripheral wiring 184a and the second peripheral wiring 184b may be surrounded by a peripheral sidewall spacer 187 and a peripheral capping pattern 185. The peripheral sidewall spacer 187 and the peripheral capping pattern 185 may be formed of nitride and/or oxynitride. According to an example embodiment of the inventive concepts, when the same operation voltage is applied to the peripheral gate 170 and the peripheral source/drain 171, the first peripheral wiring 184a and the second peripheral wiring 184b may extend laterally so as to be connected to each other.

According to the above-described semiconductor memory device, the first buried gate 127a and the second buried gate 127b controlled independently from each other may be disposed in one groove 112b. With such a configuration, it is possible to minimize the occupied area of the first and second memory cells including the first buried gate 127a and the second buried gate 127b, respectively. Because the line widths of the first buried gate 127a and the second buried gate 127b may be not defined by photolithography and may be disposed on the both inner sidewalls of the groove 112b, it is possible to minimize the occupied area of the first and second memory cells. When the line width of the groove 112b may be defined as the minimum line width (1F) by photolithography, each of the first and second memory cells can be realized with $4F^2$. As a consequence, it is possible to realize the semiconductor memory device optimized for high integration.

By the recessed lower sidewalls of the inner sidewalls of the groove 112b, the first buried gate 127a and the second buried gate 127b may be disposed in the first undercut region Uc1 and the second undercut region Uc2, respectively. With such a configuration, the line widths of the first buried gate 127a and the second buried gate 127b can be enlarged, such that the resistances of the first buried gate 127a and the second buried gate 127b can be lowered. Therefore, it is possible to realize the semiconductor memory device operating at high speed and having good reliability.

Next, the semiconductor memory device will be described according to various modified examples of the example embodiment of the inventive concepts. In the modified examples, the same reference numerals are given to the same component.

In the above-described semiconductor memory device, the first buried gate 127*a* and the second buried gate 127*b* may have the sidewalls that are self-aligned on the first upper sidewall 113 and the second sidewall 114 of the first and second inner sidewalls of the groove 112*b*, respectively. The first buried gate 127*a* and the second buried gate 127*b* may have a different form. The different form will be described with reference to the drawings.

Figure 2B:
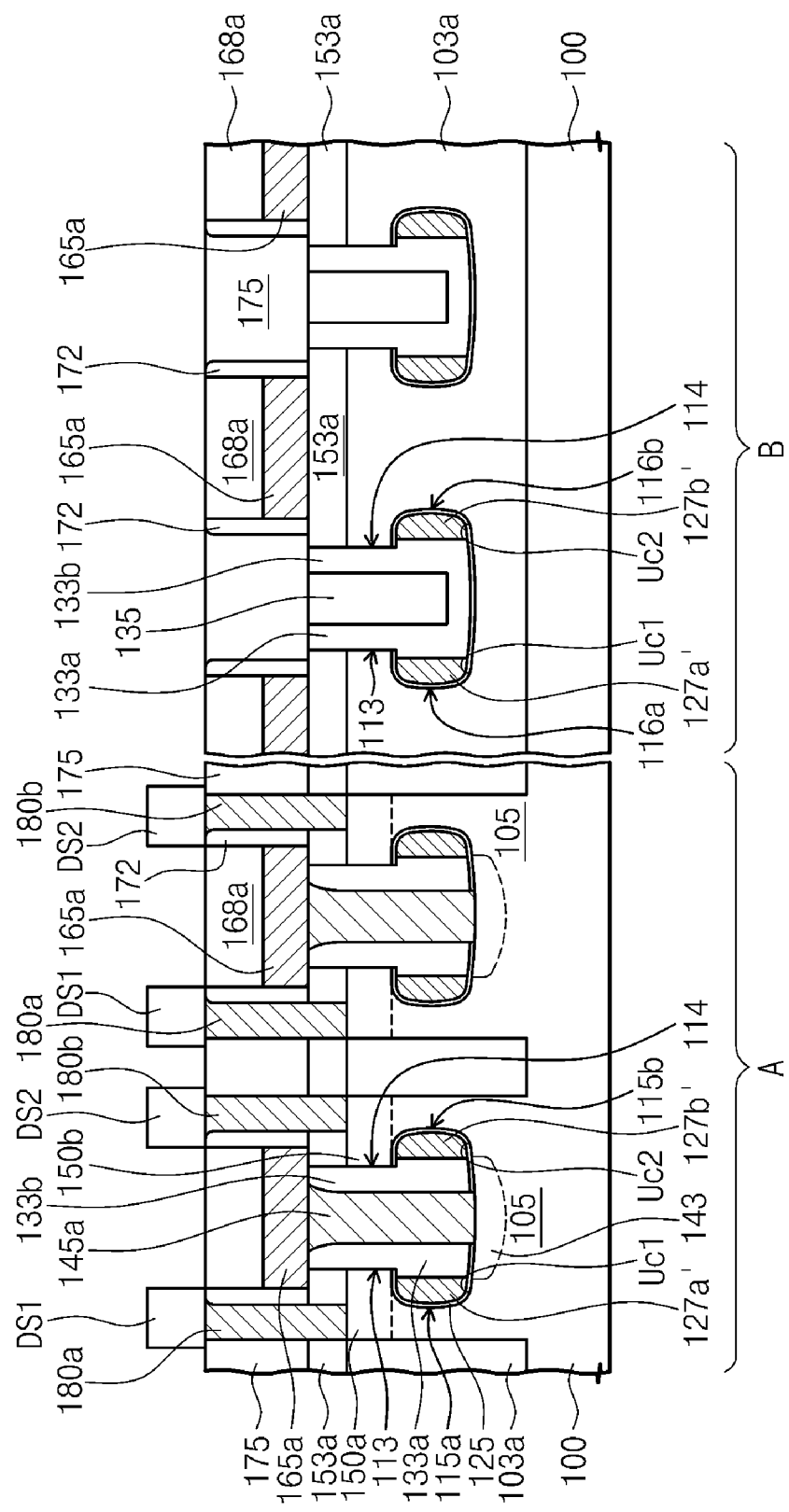
FIG. 2B is a cross-sectional view illustrating buried gates of the semiconductor memory device taken along the lines I-I' and II-II' of FIG. 1 according to a modified example of the example embodiment of the inventive concepts.

FIG. 2B is a cross-sectional view illustrating buried gates of a semiconductor memory device taken along the lines I-I' and II-II' of FIG. 1 according to a modified example of the example embodiment of the inventive concepts.

Referring to FIG. 2B, a first buried gate 127*a*' may be disposed in the first undercut region Uc1 and a second buried gate 127*b*' may be disposed in the second undercut region Uc2. The first buried gate 127*a*' may have first and second sidewalls opposite to each other. The first sidewall of the first buried gate 127*a*' may be adjacent to the lower sidewall (115*a* and 116*b*) of the first inner sidewall of the groove 112*b*. In this case, the second sidewall of the first buried gate 127*a*' may be recessed more laterally than the upper sidewall 113 of the first inner sidewall of the groove 112*b*. Therefore, the first buried gate 127*a*' may fill only a part of the first undercut region Uc1. The first insulating spacer 133*a* may extend laterally to fill another part of the first undercut region Uc1. Likewise, the second buried gate 127*b*' may have a first sidewall adjacent to the lower sidewall (115*b* and 116*a*) of the second inner sidewall of the groove 112*b* and a second sidewall opposite to the first sidewall. The second sidewall of the second buried gate 127*b*' may be recessed more laterally than the upper sidewall 114 of the groove 112*b*. The second buried gate 127*b*' may fill only a part of the second undercut region Uc2. The second insulating spacer 133*b* may extend laterally to fill another part of the second undercut region Uc2. The first buried gate 127*a*' and the second buried gate 127*b*' may be formed of the same material as that of the first buried gate 127*a* and the second buried gate 127*b* illustrated in FIGS. 1 and 2A.

By recessing the second sidewalls of the first buried gate 127*a*' and the second buried gate 127*b*' more laterally than the upper sidewalls 113 and 114, it is possible to increase a distance between the common pillar 145*a* and the first buried gate 127*a*' and a distance between the common pillar 145*a* and the second buried gate 127*b*'. Therefore, parasitic capacitance can be minimized between the common pillar 145*a* and the first buried gate 127*a*' and the second buried gate 127*b*'.

Figure 2C:
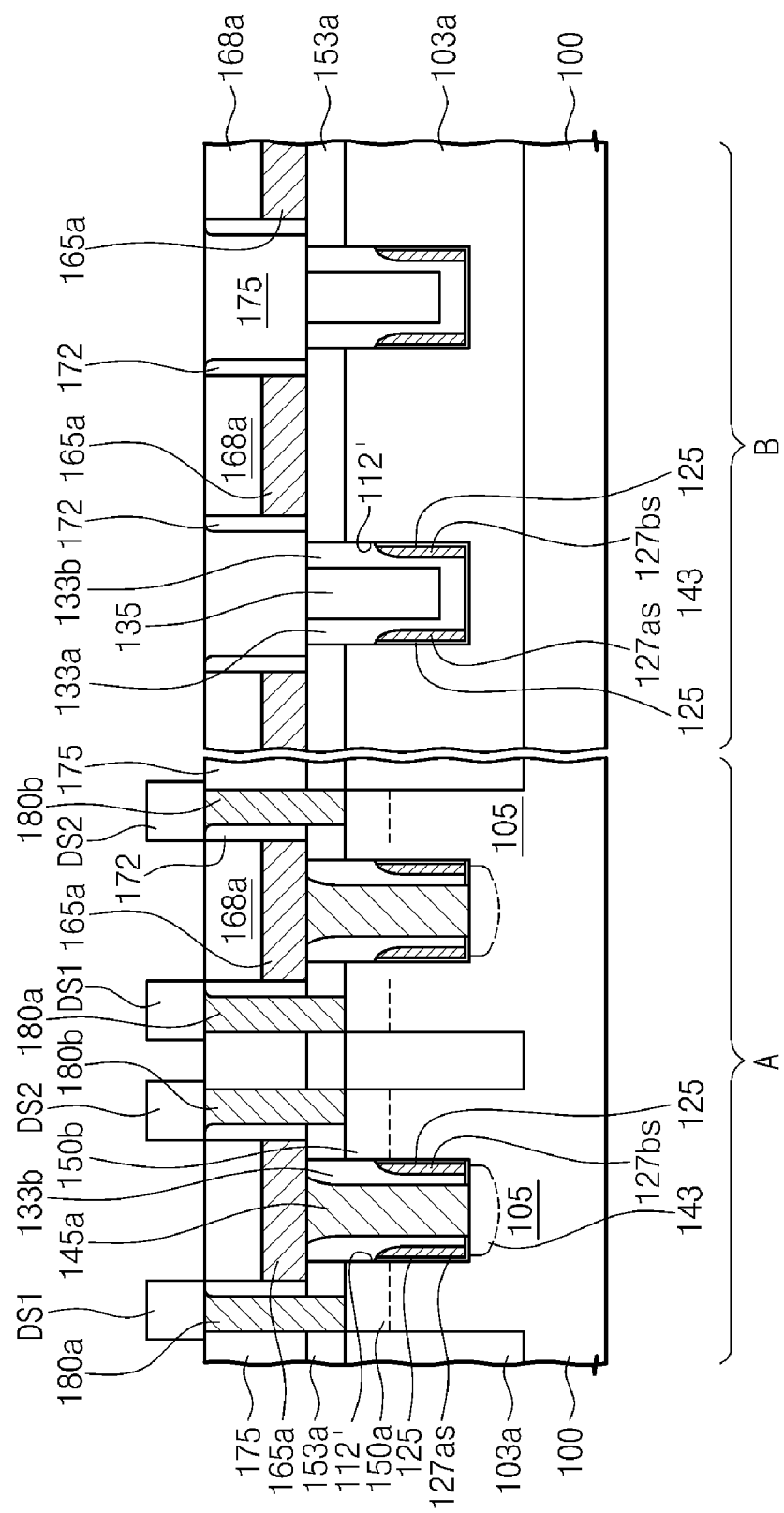
FIG. 2C is a cross-sectional view illustrating buried gates of the semiconductor memory device taken along the lines I-I' and II-II' of FIG. 1 according to another modified example of the example embodiment of the inventive concepts.

FIG. 2C is a cross-sectional view illustrating buried gates of the semiconductor memory device taken along the lines I-I' and II-II' of FIG. 1 according to another modified example of the example embodiment of the inventive concepts.

Referring to FIG. 2C, a groove 112' may have first and second inner sidewalls facing each other. The first inner sidewall of the groove 112' may have lower and upper sidewalls aligned to each other and forming one flat surface. The second inner sidewall of the groove 112' may also have lower and upper sidewalls aligned to each other and forming one flat surface. That is, the undercut regions Uc1 and Uc2 illustrated in FIGS. 2A and 2B may not be formed. A first buried gate 127 as may be disposed on the lower sidewall of the first inner sidewall of the groove 112' and a second buried gate 127*bs* may be disposed on the lower sidewall of the second inner sidewall of the groove 112'. The first buried gate 127 as and the second buried gate 127*bs* may be formed of the same material as that of the first buried gate 127*a* and the second buried gate 127*b* illustrated in FIGS. 1 and 2A.

In the above-described semiconductor memory device, the data storing elements DS1 and DS2 may be realized in various forms. The specific examples of the data storing elements DS1 and DS2 will be described with reference to the drawings.

Figure 3:
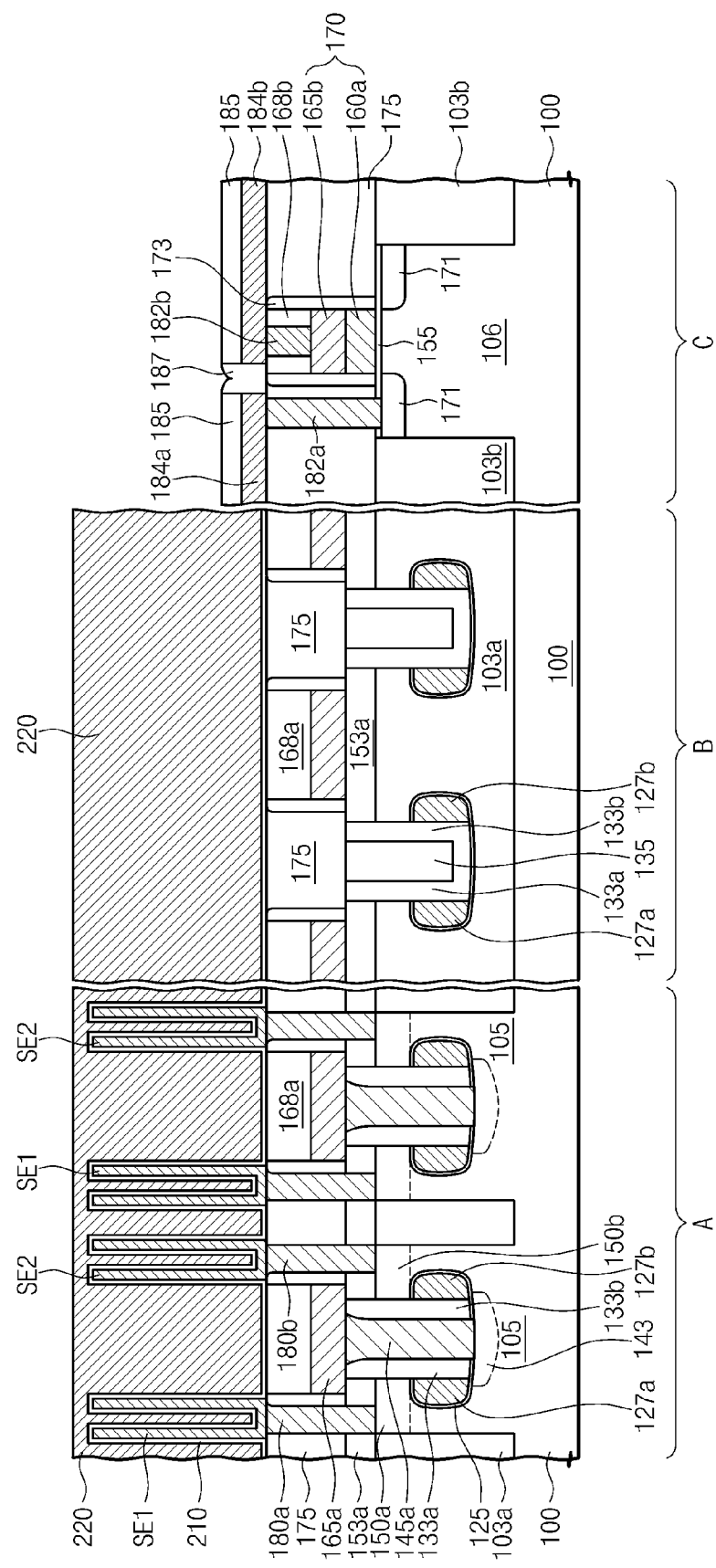
FIG. 3 is a cross-sectional view illustrating a data storing element of the semiconductor memory device taken along the lines I-I', II-II', and III-III' of FIG. 1 according to the example embodiment of the inventive concepts.

FIG. 3 is a cross-sectional view illustrating the data storing element of the semiconductor memory device taken along the lines I-I', II-II', and III-III' of FIG. 1 according to the example embodiment of the inventive concepts.

Referring to FIG. 3, a first storage electrode SE1 may be disposed on the first contract plug 180*a* and a second storage electrode SE2 may be disposed on the second contact plug 180*b*. The first storage electrode SE1 and the second storage electrode SE2 may have a cylindrical shape to increase a surface area. However, the invention is not limited thereto. The first storage electrode SE1 and the second storage electrode SE2 may be realized in shapes different from the cylindrical shape. A capacitor dielectric film 210 may be disposed on the surfaces of the first storage electrode SE1 and the second storage electrode SE2. The capacitor dielectric film 210 may have a substantially uniform thickness. An upper electrode 220 may be disposed on the capacitor dielectric film 210. The upper electrode 220 covers the surfaces of the first storage electrode SE1 and the second storage electrode SE2. A first capacitor may include the first storage electrode SE1, a part of the upper electrode 220 covering the surface of the first storage electrode SE1, and the capacitor dielectric film 210 interposed therebetween. A second capacitor may include the second storage electrode SE2, a part of the upper electrode 220 covering the surface of the second storage electrode SE2, and the capacitor dielectric film 210 interposed therebetween. The first capacitor may correspond to the first data storing element DS1 (illustrated in FIGS. 1 and 2A). The second capacitor may correspond to the second data storing element DS2 (illustrated in FIGS. 1 and 2A).

The semiconductor memory device including the first and second capacitors may correspond to a DRAM device. In this case, the common wiring 165*a* may correspond to a bit line. The common wiring 165*a* may extend in a direction perpendicular to a longitudinal direction (that is, the second direction in which the groove 112*b* extends) of the first buried gate 127*a* and the second buried gate 127*b*.

Next, different forms of the data storing elements DS1 and DS2 illustrated in FIGS. 1 and 2A will be described with reference to the drawings.

Figure 4A:
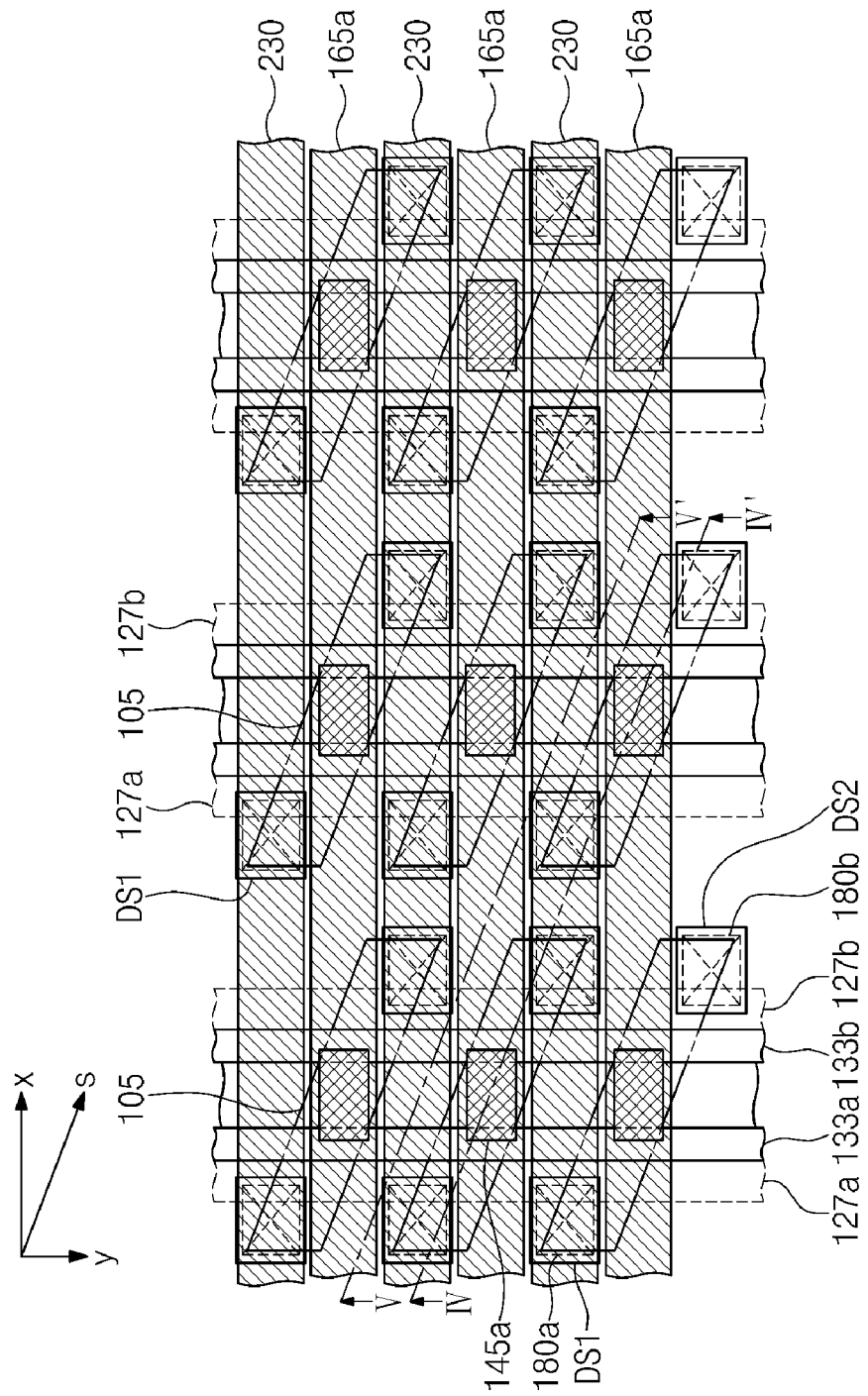
FIG. 4A is a plan view illustrating other data storing elements of the semiconductor memory device according to the example embodiment of the inventive concepts.
Figure 4B:
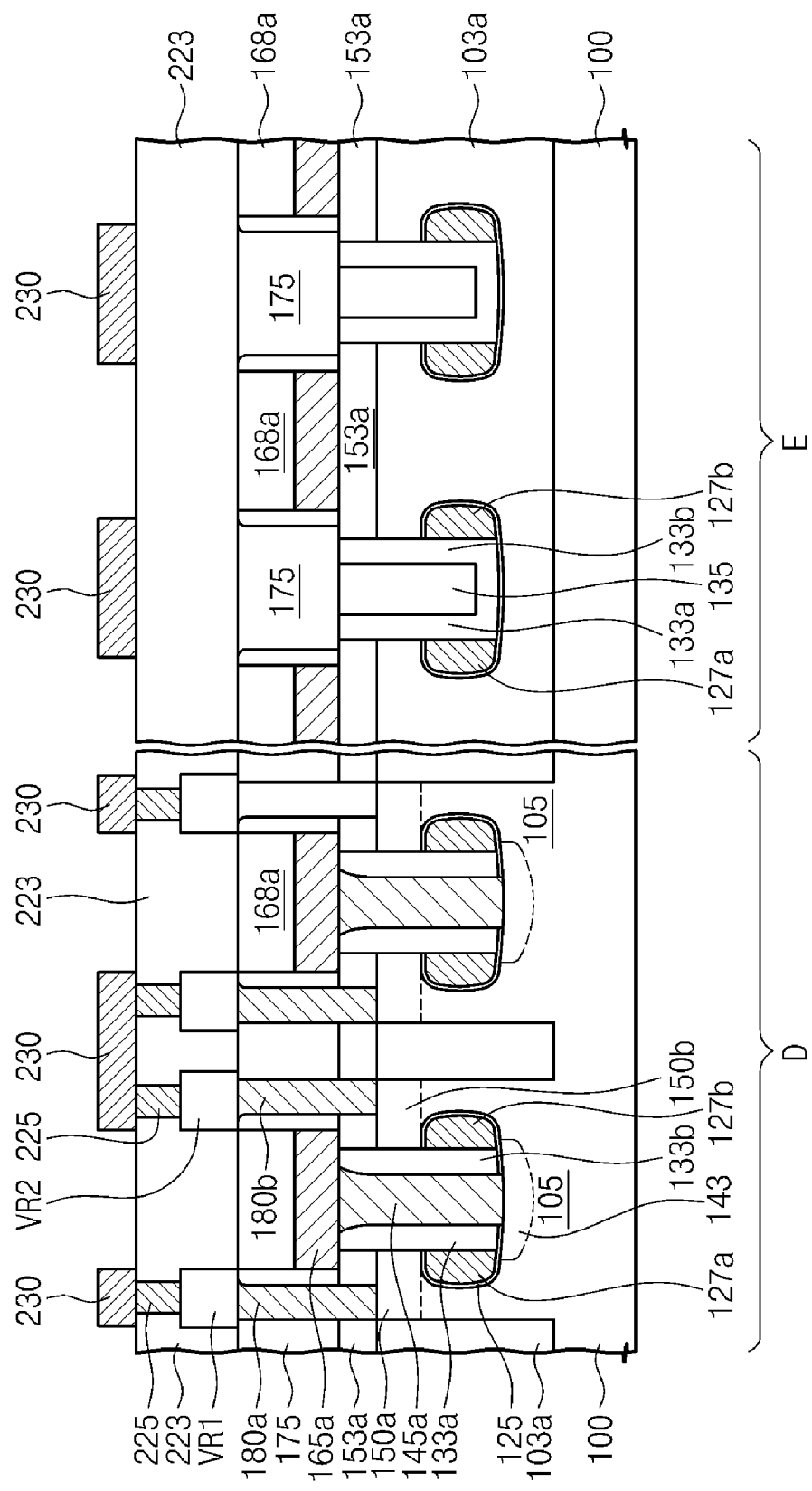
FIG. 4B is a cross-sectional view taken along the lines IV-IV' and V-V' of FIG. 4A.

FIG. 4A is a plan view illustrating the different forms of the data storing elements of the semiconductor memory device according to the example embodiment of the inventive concepts. FIG. 4B is a cross-sectional view taken along the lines IV-IV' and V-V' of FIG. 4A. In FIG. 4B, reference sign D in FIG. 4B denotes the cross-sectional view taken along the line IV-IV' of FIG. 4A and reference sign E denotes the cross-sectional view taken along the line V-V' of FIG. 4A.

Referring to FIGS. 4A and 4B, a first variable resistor VR1 and a second variable resistor VR2 are electrically connected to the first contact plug 180*a* and the second contact plug 180*b*, respectively. Each of the first variable resistor VR1 and the second variable resistor VR2 may be changeable to plural stable states of resistivities different from each other. Each of the first and second variable resistors VR1 and VR2 may be a magnetic tunnel junction pattern, a phase change material pattern, or a material pattern capable of creating or destructing a filament.

When the first and second variable resistors VR1 and VR2 are the magnetic tunnel junction patterns, each of the first and second variable resistor VR1 and VR2 may include a reference layer in which a magnetization direction is fixed, a free layer in which a magnetization direction is changeable, and a tunnel barrier layer interposed between the reference layer and the free layer. When the magnetization direction of the free layer is parallel to that of the reference layer, each of the variable resistors VR1 and VR2 may have first resistivity. When the magnetization direction of the free layer is anti-parallel to that of the reference layer, each of the variable resistors VR1 and VR2 may have second resistivity higher than the first resistivity. The magnetization direction of the free layer may be changed by a spin torque of electrons in current flowing through each of the variable resistors VR1 and VR2. The reference layer may be a multi-layer film including an anti-ferromagnetic layer, a ferromagnetic layer, and a non-magnetic layer (for example, ruthenium). The free layer may be formed of a ferromagnetic material. The tunnel barrier layer may be formed of, for example, aluminum oxide and/or magnesium oxide.

When the first and second variable resistors VR1 and VR2 are formed with the material pattern capable of creating and destructing at least a filament, the first and second variable resistors VR1 and VR2 may include at least one of niobium oxide, titanium oxide, nickel oxide, zirconium oxide, vanadium oxide, PCMO ((Pr, Ca)MnO$_3$), strontium-titanium oxide, barium-strontium-titanium oxide, strontium-zirconium oxide, barium-zirconium oxide, or barium-strontium-zirconium oxide, etc. When each of the first and second variable resistors VR1 and VR2 is formed so as to have the material pattern in which at least a filament is created, each of the variable resistors VR1 and VR2 may have low resistivity. When each of the first and second variable resistors VR1 and VR2 are formed so as to have the material pattern in which at least a filament is destructed, each of the variable resistors VR1 and VR2 may have high resistivity. The variable resistors VR1 and VR2 can store multi-bit data depending on the number of filaments being created. The filament may have a passage shape formed by connecting vacancies. Alternatively, the filament may have a metal bridge shape formed by connecting metal atoms.

When the first and second variable resistors VR1 and VR2 are formed so as to have the phase change material pattern, the first and second variable resistors VR1 and VR2 may include a phase change material having at least one of tellurium (Te) and selenium (Se), which are chalcogenide atoms. The phase change material can be changed between a crystalline state and an amorphous state. The phase change material in the crystalline state may have resistivity lower than that of the phase change material in the amorphous state. For example, the variable resistors VR1 and VR2 may include at least of Ge—Sb—Te, As—Sb—Te, As—Ge—Sb—Te, Sn—Sb—Te, Ag—In—Sb—Te, In—Sb—Te, Group 5A element-Sb—Te, Group 6A element-Sb—Te, Group 5A element-Sb—Se, Group 6A element-Sb—Se, Ge—Sb, In—Sb, Ga—Sb, or doped Ge—Sb—Te, etc.

The first variable resistor VR1 may be included in the first data storing element DS1 illustrated in FIGS. 1 and 2A. The second variable resistor VR2 may be included in the second data storing element DS2 illustrated in FIGS. 1 and 2A.

The variable resistors VR1 and VR2, the inter-layer dielectric film 175, and the common wiring 165a may be covered by an upper inter-layer dielectric film 223. An upper wiring 230 may be disposed on the upper inter-layer dielectric film 223. The upper wiring 230 may be electrically connected to the first variable resistor VR1 or the second variable resistor VR2 by an upper plug 225 formed through the upper inter-layer dielectric film 223. As illustrated in FIG. 4A, the upper wiring 230 may extend in a direction perpendicular to a direction in which the first buried gate 127a and the second buried gate 127b extend. In this case, the upper wiring 230 may be electrically connected to the first variable resistors VR1 respectively connected to the cell active portions 105 constituting one row and the second variable resistors VR2 respectively connected to the cell active portions 105 constituting another row adjacent to the one row. However, the invention is not limited thereto. According to an example embodiment of the inventive concepts, the upper wiring 230 may extend parallel to the cell active portion 105 and may be electrically connected to the first variable resistor VR1 and the second variable resistor VR2 connected to each cell active portion 105.

When the variable resistors VR1 and VR2 are included in the data storing elements, the upper wiring 230 may correspond to a bit line. In this case, the common wiring 165a may serve as a wiring to which a reference voltage (for example, a ground voltage) is applied. As illustrated in FIG. 4A, the common wiring 165a may extend in a direction perpendicular to the longitudinal direction of the first buried gate 127a and the second buried gate 127b. Alternatively, the common wiring 165a may extend in parallel to the first buried gate 127a and the second buried gate 127b.

The data storing elements including the variable resistors VR1 and VR2 may be applicable to the semiconductor memory device illustrated in FIGS. 1, 2A, 2B, and 2C. Moreover, the data storing elements including the variable resistors VR1 and VR2 may be applicable to semiconductor memory devices according to other modified examples (see FIGS. 5, 6, and 7), which are described below. When the semiconductor memory device according to the embodiments of the inventive concept may include the variable resistors VR1 and VR2, the semiconductor memory device may be realized as a non-volatile memory device. The semiconductor memory devices according to the modified examples may include the peripheral circuit region 95 and the peripheral field-effect transistor illustrated in FIGS. 1 and 2A.

The above-described cell active portions 105 may have another form, which will be described with reference to the drawings.

Figure 5:
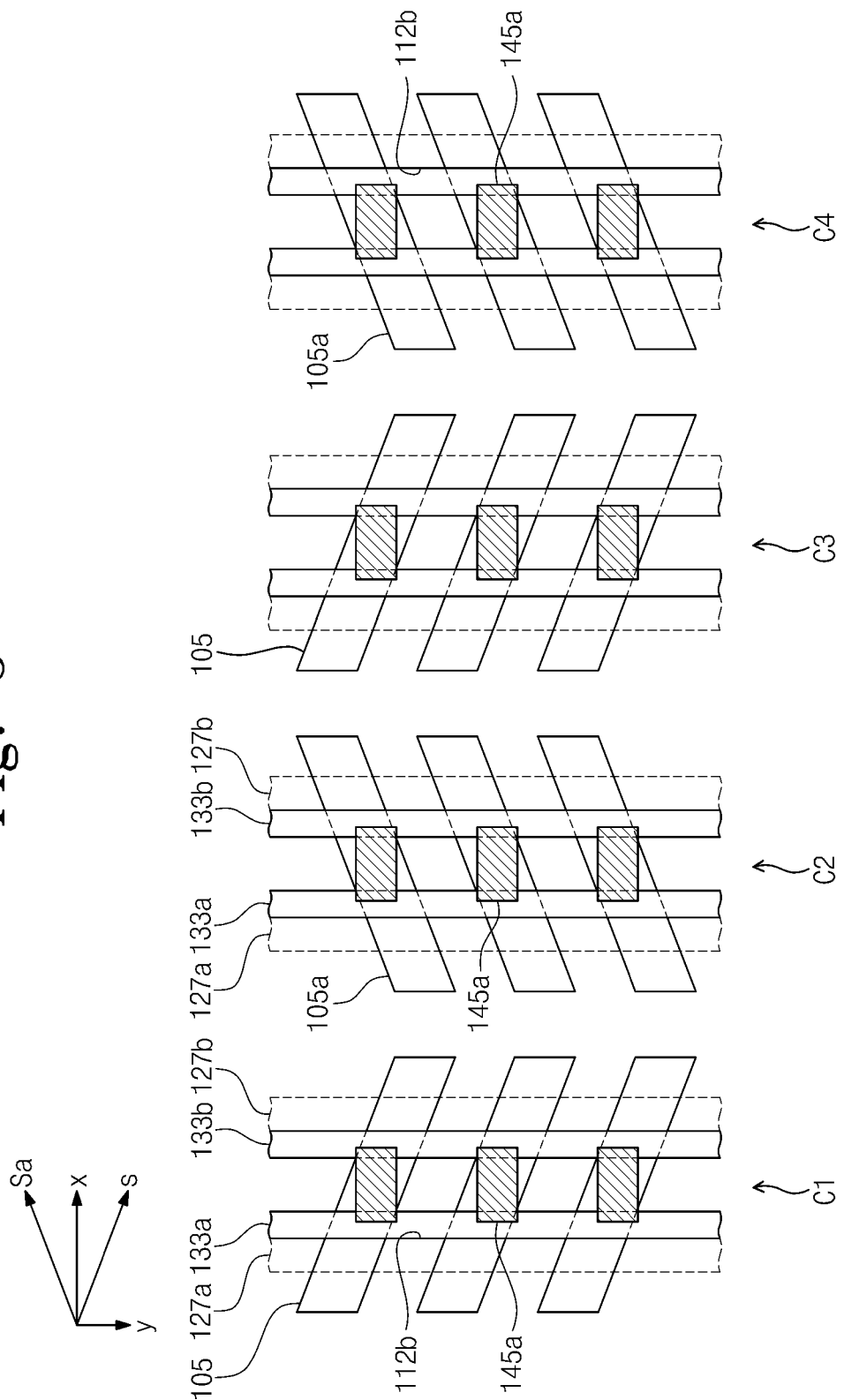
FIG. 5 is a plan view illustrating a semiconductor memory device according to a modified example of the example embodiment of the inventive concepts.

FIG. 5 is a plan view illustrating a semiconductor memory device according to a modified example of the example embodiment of the inventive concepts.

Referring to FIG. 5, a plurality of cell active portions 105 and 105a are arranged two-dimensionally along rows and columns (C1, C2, C3, C4, . . . ) in the cell array region of the substrate. The cell active portions 105 and 105a may include first cell active portions 105 formed in odd-numbered columns (C1, C3, . . . ) and second cell active portions 105a formed in even-numbered columns (C2, C4, . . . ). Each of the first cell active portions 105 may extend in a first direction and each of the second cell active portions 105a may extend in a second direction different from the first direction.

The plurality of grooves 112b extends in a third direction. Each groove 112b may intersect the cell active portions 105 or 105a in each of the columns (C1, C2, C3, C4, . . . ). The grooves 112b may be parallel to the columns. The first buried gate 127a and the second buried gate 127b are disposed in each groove 112b so as to extend in parallel to each other in the third direction. The third direction corresponds to a y-axis direction in FIG. 5. The third direction is not parallel to the first and second directions. The third direction may not be perpendicular to the first and second directions.

The first active portion 105 may be symmetric to the second active portion 105a. Specifically, the first active portions 105 in the first column C1 may be symmetric to the second active portions 105a in the second column C2 with reference to an imaginary line passing between the first column C1 and the second column C2 and extending in the third direction. Therefore, the first active portions 105 and the second active portions 105a formed in the columns may be arranged in a wave shape. The first direction may correspond to an "s" direction in FIG. 5. The second direction may correspond to the "sa" direction in FIG. 5.

In FIG. 5, the features of the modified example are illustrated in more detail for easy description. However, the invention is not limited to this modified example. The features of the semiconductor memory device described with reference to FIGS. 1 through 4 are applicable to the modified example in FIG. 5. The semiconductor memory device according to this modified example may include the peripheral circuit region 95 and the peripheral field-effect transistor illustrated in FIGS. 1 and 2A.

Figure 6A:
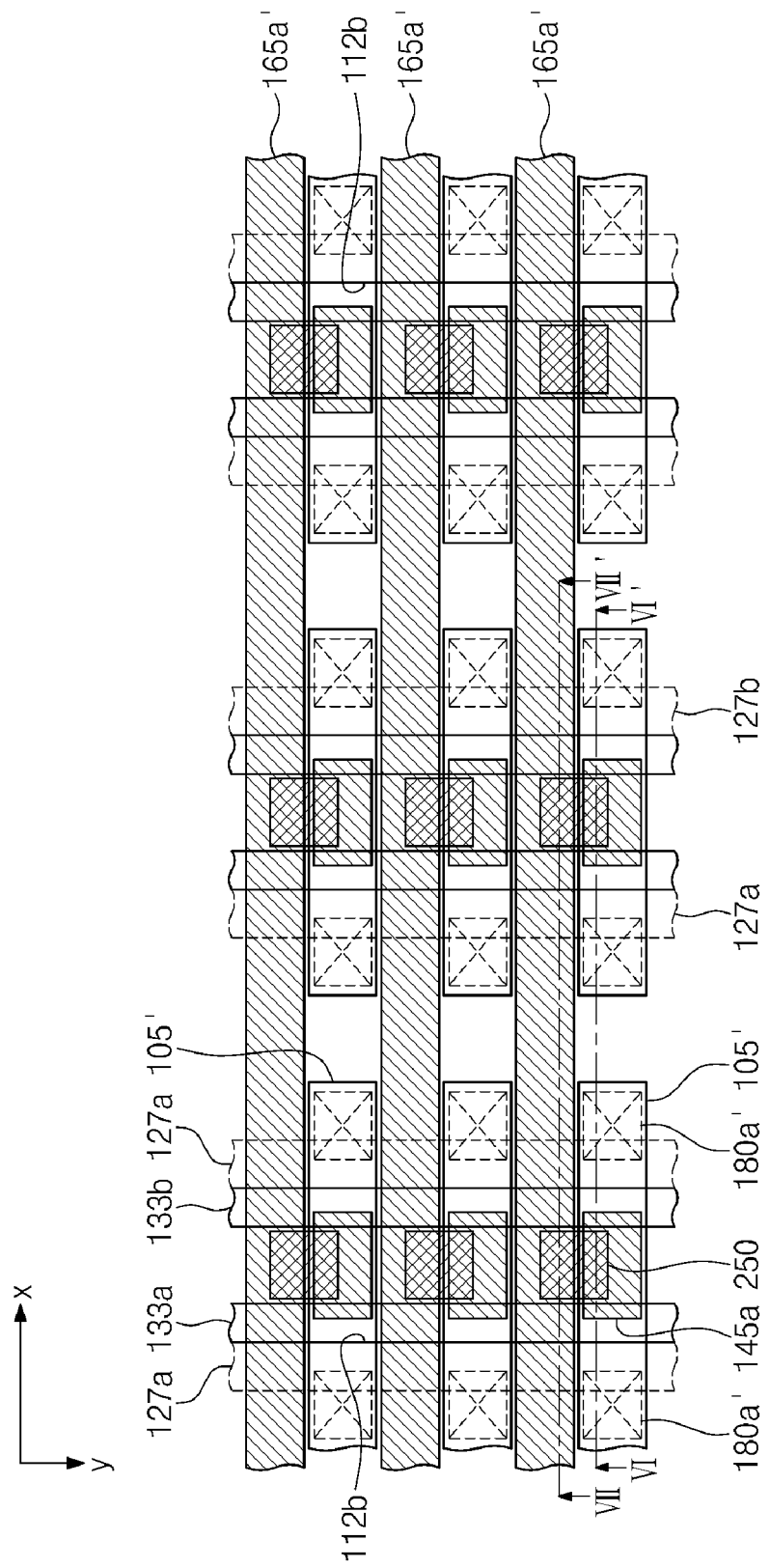
FIG. 6A is a plan view illustrating a semiconductor memory device according to another modified example of the example embodiment of the inventive concepts.

FIG. 6A is a plan view illustrating a semiconductor memory device according to another modified example of the example embodiment of the inventive concepts. FIG. 6B is a cross-sectional view taken along the line VI-VI' and VII-VII' of FIG. 6A. In FIG. 6B, reference numeral F denotes the cross-sectional view taken along the line VI-VI' of FIG. 6A and reference numeral G denotes the cross-sectional view along the line VII-VII' of FIG. 6A.

Referring to FIGS. 6A and 6B, a plurality of cell active portions 105' are arranged two-dimensionally on the substrate 100 along rows and columns. Each cell active portion 105' may have a rectangular shape extending in a first direction. A plurality of grooves 112b may extend in parallel in a second direction. Each groove 112b intersects the plurality of cell active portions 105' constituting each column and the cell device isolation pattern 103a between the cell active portions 105'. The first buried gate 127a and the second buried gate 127b are disposed in each groove 112b.

As illustrated in FIG. 6A, the first direction which is the longitudinal direction of each cell active portion 105' may be perpendicular to the second direction which is the longitudinal direction of the groove 112b. According to this modified example, the first direction may correspond to an x-axis direction of FIG. 6A and the second direction may correspond to a y-axis direction of FIG. 6B.

According to this modified example, a common wiring 165a' may extend in the first direction. The common wiring 165a' may be disposed above the cell device isolation pattern 103a between a pair of adjacent rows. The common wiring 165a' may contact a conductive pad 250 that contacts the common pillar 145a. Specifically, the conductive pad 250 may contact the upper surface of the common pillar 145a and extend in the second direction so as to be disposed above the cell device isolation pattern 103a between the pair of rows. The common wiring 165a' may come into contact with the upper surface of a part of the conductive pad 250 located above the cell device isolation pattern 103a. The conductive pad 250 may be disposed in a lower inter-layer dielectric film 248 interposed between the capping dielectric film 153a and the inter-layer dielectric film 175. The upper surface of the lower inter-layer dielectric film 248 may be coplanar with the upper surface of the conductive pad 250. For example, the conductive pad 250 may include at least one of a doped semiconductor material (for example, doped silicon or doped germanium), a conductive metal nitride (for example, titanium nitride or tantalum nitride), a metal (for example, tungsten, titanium, or tantalum), or a metal-semiconductor compound (for example, tungsten silicide, cobalt silicide, or titanium silicide), etc. The lower inter-layer dielectric film 248 may be formed of oxide, nitride, and/or oxynitride. A first contact plug 180a' and a second contact plug 180b' may penetrate the inter-layer dielectric film 175, the lower inter-layer dielectric film 248, and the capping dielectric film 153a to come into contact with the first doped region 150a and the second doped region 150b, respectively. The first data storing element DS1 and the second data storing element DS2 illustrated in FIGS. 1 and 2A may come into contact with the upper surfaces of the first contact plug 180a' and the second contact plug 180b', respectively. The capacitors illustrated in FIG. 3 or the variable resistors illustrated in FIGS. 4A and 4B may be applied to the first data storing element DS1 and the second data storing element DS2. The common wiring 165a' may be formed of the same material as that of the common wiring 165a illustrated in FIGS. 1 and 2A. The first contact plug 180a' and the second contact plug 180b' may be formed of the same material as that of the first contact plug 180a and the second contact plug 180b illustrated in FIGS. 1 and 2A.

According to an example embodiment of the inventive concepts, when the first and second data storing elements connected to the first contact plug 180a' and the second contact plug 180b' include the variable resistors illustrated in FIGS. 4A and 4B, the common wiring 165a'illustrated in FIGS. 6A and 6B may extend in the second direction (that is, the direction parallel to the first buried gate 127a and the second buried gate 127b). In this case, the conductive pad 250 and the lower inter-layer dielectric film 248 may not be formed. The semiconductor memory device described with reference to FIGS. 6A and 6B may include the peripheral circuit region 95 and the peripheral field-effect transistor illustrated in FIGS. 1 and 2A.

FIG. 7A is a plan view illustrating a semiconductor memory device according to still another modified example of the example embodiment of the inventive concepts. FIG. 7B is a cross-sectional view taken along the line VIII-VIII' and IX-IX' of FIG. 7A. In FIG. 7B, reference numeral H denotes the cross-sectional view taken along the line VIII-VIII' of FIG. 7A and reference numeral I denotes the cross-sectional view along the line IX-IX' of FIG. 7A.

Referring to FIGS. 7A and 7B, a plurality of cell active portions 105 may be arranged two-dimensionally on the substrate 100 of the cell array region along rows and columns. Each cell active portion 105 may have a rectangular shape extending in a first direction. A groove 112b' is disposed in the cell active portions 105 and the cell device isolation pattern 103a between the cell active portions 105. The groove 112b' extends in a second direction. The first direction may correspond to a "s" direction of FIG. 7A, and the second direction may correspond to a y-axis direction of FIG. 7B.

The groove 112b' has a first and a second inner sidewall facing each other and a bottom surface. The first inner sidewall of the groove 112b' may include an upper sidewall 113 and a lower sidewall. The second inner sidewall of the groove 112b' may include an upper sidewall 114 and a lower sidewall. The lower sidewall of the first inner sidewall may be recessed more laterally than the upper sidewall 113 to define a first undercut region Uc1'. The lower sidewall of the second inner sidewall may be recessed more laterally than the upper sidewall 114 to define a second undercut region Uc2'.

The lower sidewall of the first inner sidewall of the groove 112b' may include a first active lower sidewall 115a formed by the cell active portion 105 and a first non-active lower sidewall 116a' for by the cell device isolation pattern 103a. The first non-active lower sidewall 116a' may be recessed more laterally than the first active lower sidewall 115a. Therefore, the lower sidewall of the first inner sidewall of the groove 112b' may further include a sidewall that is formed of the cell active portion 105 being located between the first non-active lower sidewall 116a' and the first active lower sidewall 115a and extends in the first direction. A first width W1 of a first portion of the first undercut region Uc1' located in the cell active portion 105 may be smaller than a second width W2 of a second portion of the first undercut region Uc1' located in the cell device isolation pattern 103a.

Likewise, the lower sidewall of the second inner sidewall of the groove 112b' may include a second active lower sidewall 115b formed by the cell active portion 105 and a second non-active lower sidewall 116b' formed by the cell device isolation pattern 103a. The second non-active lower sidewall 116b' may be recessed more laterally than the second active lower sidewall 115b. Therefore, the lower sidewall of the second inner sidewall of the groove 112b' may further includes a sidewall that is formed of the cell active portion 105 being located between the second non-active lower sidewall 116b' and the second active lower sidewall 115b and extends in the first direction. A first width of a first portion of the second undercut region Uc2' located in the cell active portion 105 may be smaller than a second width of a second portion of the second undercut region Uc2' located in the cell device isolation pattern 103a.

The first buried gate 127a may be formed in the first undercut region Uc1' so as to be disposed on the lower sidewall of the first inner sidewall. The second buried gate 127b may be formed in the second undercut region Uc2' so as to be disposed on the lower sidewall of the second inner sidewall. The gate dielectric film 125 is interposed between the first buried gate 127a and the first inner sidewall and between the second gate 127b and the second inner sidewall.

By the shape of the first undercut region Uc1', the first buried gate 127a may cover the first active lower sidewall 115a, the first non-active lower sidewall 116a', and the sidewall extending in the first direction and being formed of the cell active portion 105 between the first active lower sidewall 115a and the first non-active lower sidewall 116a' in the lower sidewall of the first inner sidewall. Therefore, a channel region 310 controlled by the first buried gate 127a may be realized in a three-dimensional shape including a portion 305 extending in the first direction and a portion 300 extending in the second direction. In this case, a common doped region 143' located below the bottom surface of the groove 112b' may extend laterally. One end of the common doped region 143' may extend laterally by the degree that the first non-active lower sidewall 116a' is recessed more laterally than the first active lower sidewall 115a. As a consequence, because the channel width of the channel region 310 is enlarged, it is possible to increase turn-on current of the first field-effect transistor including the first buried gate 127a.

Likewise, by the shape of the second undercut region Uc2', the second buried gate 127b may cover the second active lower sidewall 115b, the second non-active lower sidewall 116b', and the sidewall extending in the first direction and being formed of the cell active portion 105 between the second active lower sidewall 115b and the second non-active lower sidewall 116b' in the lower sidewall of the second inner sidewall. Therefore, a channel region controlled by the second buried gate 127b may also be realized in a three-dimensional shape including a portion extending in the first direction and a portion extending in the second direction. In this case, the other end of the common doped region 143' may extend laterally by the degree that the second non-active lower sidewall 116b' is recessed more laterally than the second active lower sidewall 115b.

The technical spirit according to the modified example is applicable to the semiconductor memory devices described with reference to FIGS. 1, 2A, 2B, 3, 4, 5, and 6.

Next, methods of forming the semiconductor memory device according to an embodiment of the inventive concept will be described.

FIGS. 8 through 24 are cross-sectional views illustrating the semiconductor memory device taken along the lines I-II-II', and III-III' of FIG. 1 according to the example embodiment of the inventive concepts.

Referring to FIG. 8, the substrate 100 may be prepared which includes the cell array region and the peripheral circuit region. Cell trenches defining the cell active portions 105 may be formed in the cell array region and peripheral trenches defining the peripheral active portions 106 may be formed in the peripheral circuit region. The cell active portion 105 may extend in the first direction, as in FIG. 1. The cell device isolation patterns 103a filling the cell trenches may be formed and the peripheral device isolation patterns 103b filling the cell trenches may be formed. The cell device isolation pattern 103a and the peripheral device isolation pattern 103b may include a thermal oxide layer formed on the sidewalls of the cell and peripheral trenches. The cell device isolation pattern 103a and the peripheral device isolation pattern 103b may further include a liner layer formed on the thermal oxide layer. The liner layer may be formed as, for example, a nitride layer and/or an oxynitride layer. The cell device isolation pattern 103a and the peripheral device isolation pattern 103b may further include a filling oxide layer on the liner layer to fill the cell and peripheral trenches. The filling oxide film may include a high density plasma oxide layer and/or an SOG layer (Spin On Glass layer), for example. According to an example embodiment of the inventive concepts, the width of the cell trench is smaller than that of the peripheral trench. Therefore, the cell device isolation pattern 103a may include only the thermal oxide layer and the liner layer, and the peripheral device isolation pattern 103b may include the thermal oxide layer, the liner layer, and the filling oxide layer.

Although not illustrated, when the thermal oxide layer is formed in the peripheral device isolation pattern 103b, a thermal oxide layer may be fog on the upper surfaces of the cell active portion 105 and the peripheral active portion 106. The thermal oxide layer on the upper surfaces of the active portions 105 and 106 may serve as a buffer oxide layer.

A hard mask film 110 may be formed on the entire surface of the substrate 100 including the device isolation patterns 103a and 103b. The hard mask film 110 may be formed of a material having etching selectivity to the active portions 105 and 106. For example, the hard mask film 110 may include a nitride film and/or an oxynitride film. According to an example embodiment of the inventive concepts, the hard mask film 110 may further include an oxide film located below the nitride film and/or the oxynitride film.

The hard mask film 110 may be patterned to form openings 111. The openings 111 may extend in a second direction being non-parallel to the first direction to intersect the cell active portions 105. The cell active portion 105 and the cell device isolation pattern 103a may be disposed below the bottom surface of the opening 111. In the cell array region, the plurality of openings 111 may be formed in parallel in the second direction in the hard mask film 110. The hard mask film 110 in the peripheral circuit region may cover the peripheral active portion 106 and the peripheral device isolation pattern 103b.

Figure 9:
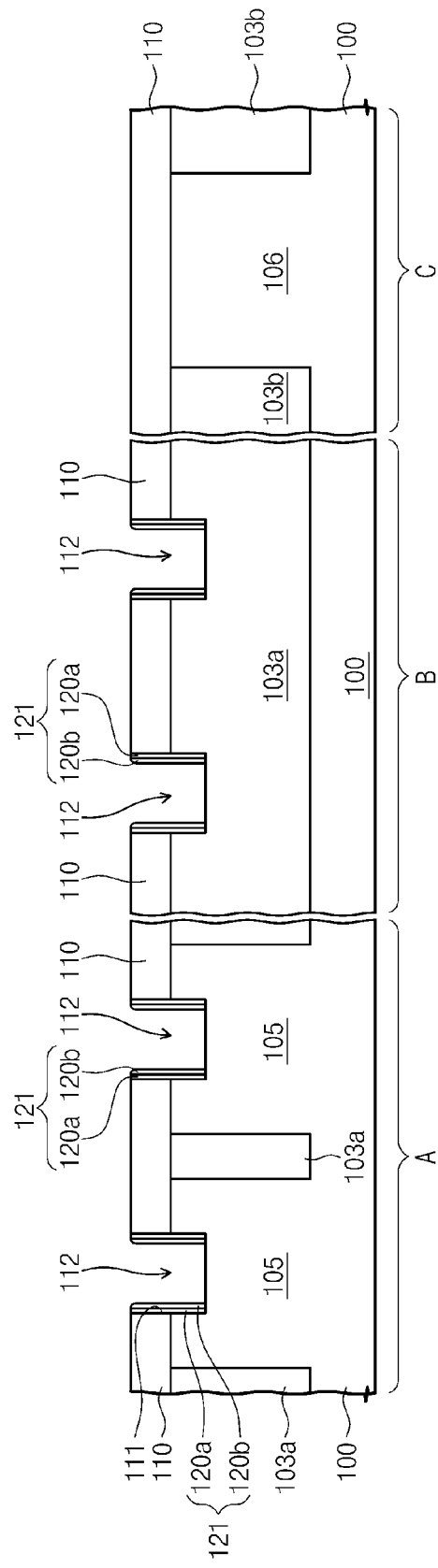

Referring to FIG. 9, a first preliminary groove 112 may be formed in the cell active portion 105 and the cell device isolation pattern 106 below the opening 111 by performing a first anisotropic etching process using the hard mask pattern 110 as an etching mask. Both inner sidewalls of the first preliminary groove 112 in the cell active portion 105 and the device isolation pattern 106 may correspond to the upper sidewalls 113 and 114 of the first and second inner sidewalls of the groove 112b illustrated in FIG. 2A.

Etching protection spacers 121 may be formed on the both inner sidewalls of the opening 111 and the first preliminary groove 112, respectively. The etching protection spacer 121 may be multi-layered. For example, the etching protection spacer 121 may include a first spacer 120a and a second spacer 120b. The first spacer 120a may be disposed between the second spacer 120b and the both inner sidewalls of the opening 111 and the first preliminary groove 112. The first spacer 120a and the second spacer 120b may be formed of materials different from each other. The bottom surface of the first preliminary groove 112 is exposed between the etching protection spacers 121.

Figure 10:
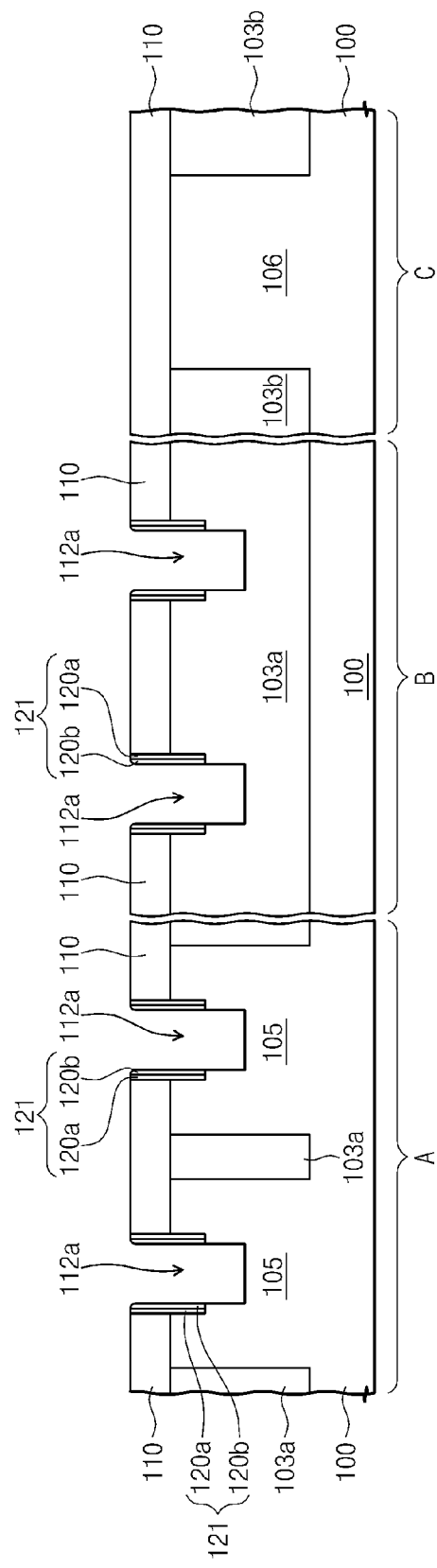

Referring to FIG. 10, the bottom surface of the first preliminary groove 112 may be etched by performing a second anisotropic etching process using the hard mask film 110 and the etching protection spacers 121 as etching masks. Therefore, a second preliminary groove 112a may be formed. Upper sidewalls of both inner sidewalls of the second preliminary groove 112a may be covered with the etching protection spacers 121. Lower sidewalls of the both inner sidewalls of the second preliminary groove 112a are exposed. The bottom surface of the second preliminary groove 112a is also exposed.

Figure 11:
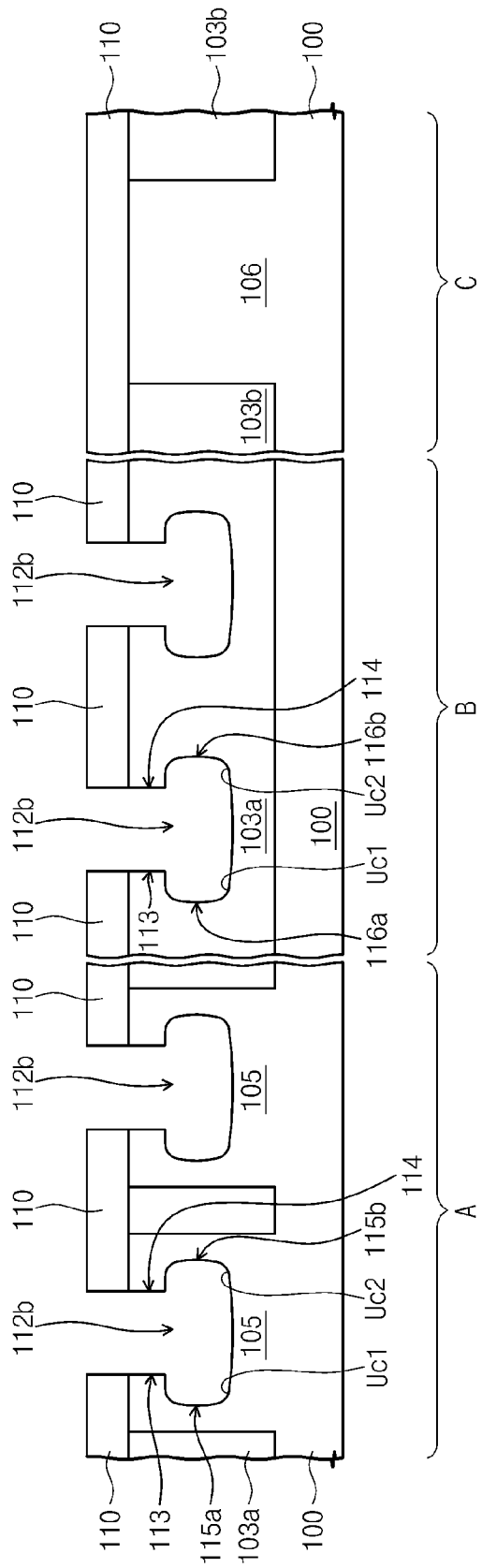

Referring to FIG. 11, both lower sidewalls of the preliminary groove 112a below the etching protection spacer 121 are recessed laterally by using the hard mask film 110 and the etching protection spacer 121 as an etching mask. Therefore, the groove 112b may be formed.

The recessing process of the both lower sidewalls of the second preliminary groove 112a may include a first recessing process and a second recessing process. Portions farmed of the cell active portion 105 of the both lower sidewalls of the second preliminary groove 112a may be recessed laterally by the first recessing process. The first recessing process may be isotropic etching (for example, wet etching). Portions formed of the cell device isolation pattern 103a of the both lower sidewalls of the second preliminary groove 112a may be recessed laterally by the second recessing process. The second recessing process may also be isotropic etching (for example, wet etching). The second recessing process may be performed after the first recessing process. Alternatively, the first recessing process may be performed after the second recessing process.

When the cell device isolation pattern 103a may be formed of a multi-layer film, the second recessing process may include a plurality of sub recessing processes. For example, when the cell device isolation pattern 103a includes the thermal oxide layer and the liner layer, the second recessing process may include first sub recessing process and second sub recessing process. Portions formed of the thermal oxide layer in the both lower sidewalls of the second preliminary groove 112a may be recessed laterally by the first sub recessing process. Portions formed of the liner layer in the both lower sidewalls of the second preliminary groove 112a may be recessed laterally by the second sub recessing process. The first and second sub recessing process may be isotropic etching.

According to an example embodiment of the inventive concepts, the second sub recessing process (for example, the recessing of the liner layer) may be performed after the first sub recessing process (for example, the recessing of the thermal oxide film). In this case, the second spacer 120b may be formed of a material having etching selectivity to the thermal oxide layer and the first spacer 120a may be formed of a material having etching selectivity to the liner layer. For example, the second spacer 120b may be formed of nitride and/or oxynitride and the first spacer may be formed of oxide.

Alternatively, the first sub recessing process may be performed after the second sub recessing process. In this case, the second spacer 120b may be formed of a material having etching selectivity to the liner layer and the first spacer 120a may be formed of a material having etching selectivity to the thermal oxide layer. For example, the second spacer 120b may be formed of oxide and the first spacer 120a may be formed of nitride and/or oxynitride.

According to an embodiment of the inventive concept, the recess depth in the second recessing process (that is, the recessing of the portions formed by the cell device isolation pattern 103a) may be substantially the same as the recess depth in the first recessing process (that is, the recessing of the portions formed by the cell active portion 105). In this way, it is possible to form the groove 112b described with reference to FIGS. 1 and 2A.

Alternatively, the recess depth in the second recessing process may be deeper than the recess depth in the first recessing process. In this way, it is possible to form the groove 112b' described with reference to FIGS. 7A and 7B.

During the first recessing process and the second recessing process, the upper sidewalls of the groove 112b may be protected by the etching protection spacer 121. In this way, the first undercut region Uc1 and the second undercut region Uc2 may be defined in the groove 112b. After the first recessing process and the second recessing process, the remaining etching protection spacer 121 may be removed to expose the upper sidewalls of the groove 112b.

Figure 12:
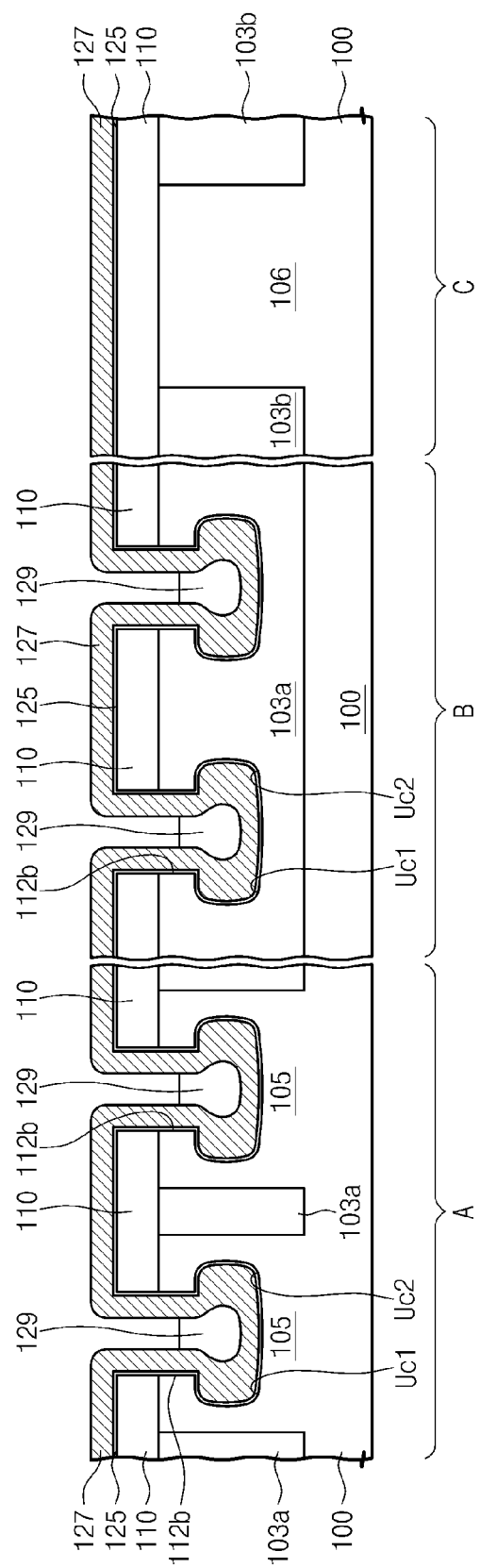

Referring to FIG. 12, a gate dielectric film 125 may be formed on the exposed first and second inner sidewalls of the groove 112b. The gate dielectric film 125 may be formed by the thermal oxidation. Alternatively, the gate dielectric film 125 may be formed by atomic layer deposition. The gate dielectric film 125 may include at least one of an oxide, a nitride, an oxynitride, and/or a high-k material (for example, a hafnium oxide or an aluminum oxide).

A gate conductive film 127 may be formed on the substrate 100 having the gate dielectric film 125. The gate conductive film 127 may fill the first undercut region Uc1 and the second undercut Uc2. The gate conductive film 127 may fill a part of the groove 112b.

A sacrificial film may be formed on the substrate 100 so as to fully fill the groove 112b. The sacrificial film may be planarized until the gate conductive film 127 is exposed. The planarized sacrificial film may further be recessed. As illustrated in FIG. 12, the upper surface of the recessed sacrificial film 129 may be lower than the uppermost surface of the cell active portion 105. The sacrificial film 129 may be formed of a material having etching selectivity to the hard mask film 110 and the gate conductive film 127. For example, the recessed sacrificial film 129 may be formed of oxide.

Figure 13:
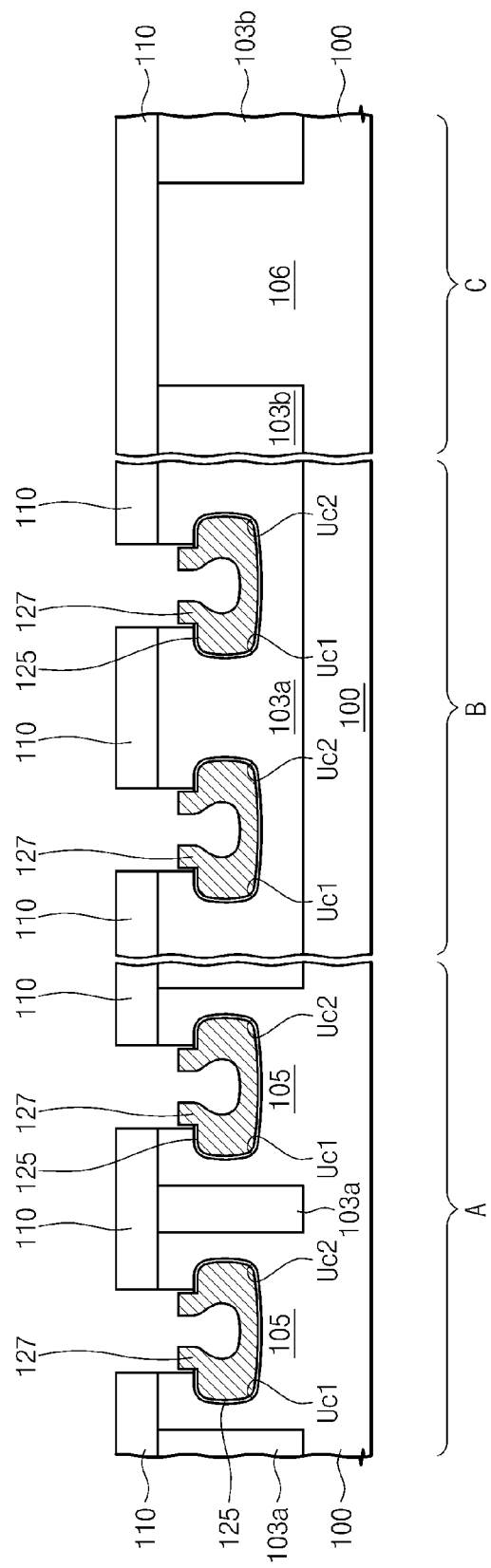

Referring to FIG. 13, subsequently, a part of the gate conductive film 127 located above the upper surface of the recessed sacrificial film 129 may be removed. A part of the gate conductive film 127 may be removed by isotropic etching. In this case, the portions of the gate conductive film 127, filling the undercut regions Uc1 and Uc2, may remain and a portion of the gate conductive film 127, located below the recessed sacrificial film 129, may remain.

Subsequently, the recessed sacrificial film 129 may be removed. When the recessed sacrificial film 129 is recessed, parts of the gate dielectric film 125 formed on the upper sidewalls of the grooves 112b may be removed. At this time, at least the gate dielectric film 125, which is located in the undercut regions Uc1 and Uc2, remains.

Figure 14:
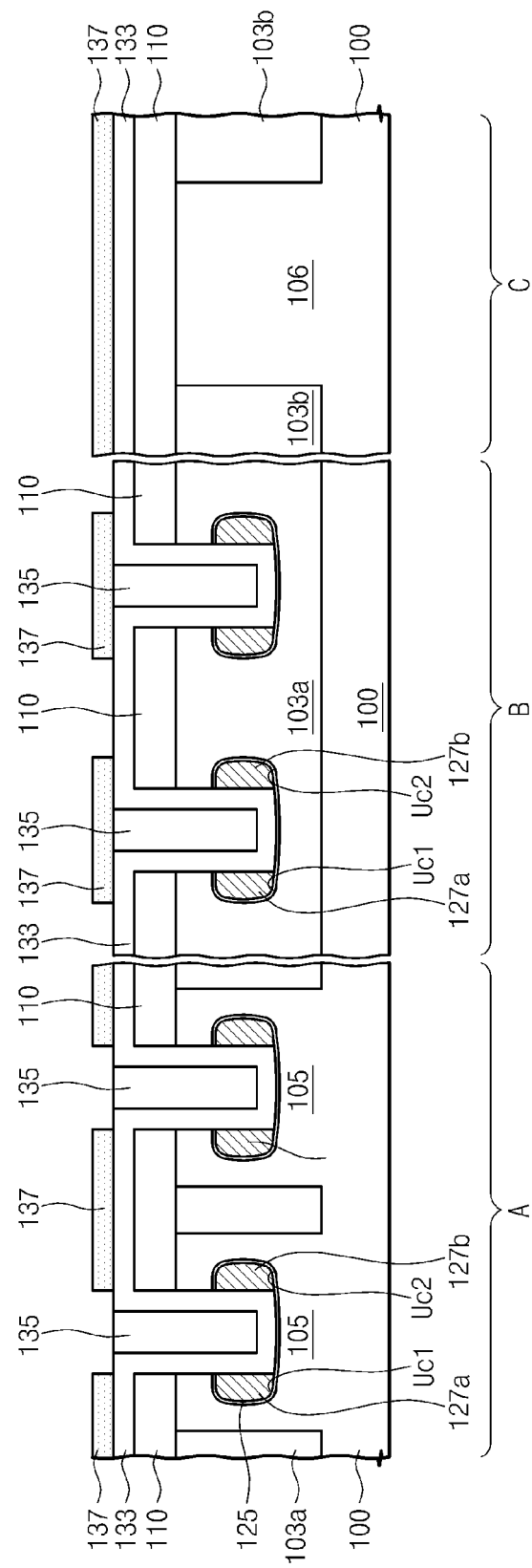

Referring to FIG. 14, the remaining gate conductive film 127 may be anisotropic etched by using the hard mask film 110 as an etching mask. Therefore, the first buried gate 127a may be formed in the first undercut region Uc1 and the second buried gate 127b may be formed in the second undercut region Uc2.

Subsequently, an insulating spacer film 133 may conformally be formed on the entire surface of the substrate 100. The insulating spacer film 133 covers the first buried gate 127a and the second buried gate 127b.

According to an example embodiment of the inventive concepts, the first buried gate 127a and the second buried gate 127b may be recessed by isotropic etching before the insulating spacer film 133 is formed. In this way, it is possible to form the first buried gate 127a' and the second buried gate 127b' described with reference to FIG. 2B.

A filling dielectric film may be formed on the insulating spacer film 133 so as to fill the groove 112b. The filling dielectric film may be planarized until the insulating spacer film 133 on the hard mask film 110 is exposed such that a filling dielectric pattern 135 is formed. The filling dielectric pattern 135 may be formed of a dielectric material having etching selectivity to the insulating spacer film 133 and the hard mask film 110. For example, the insulating spacer film 133 and the hard mask film 110 may be formed of nitride and/or oxynitride, and the filling dielectric pattern 135 may be formed of oxide.

Figure 25A:
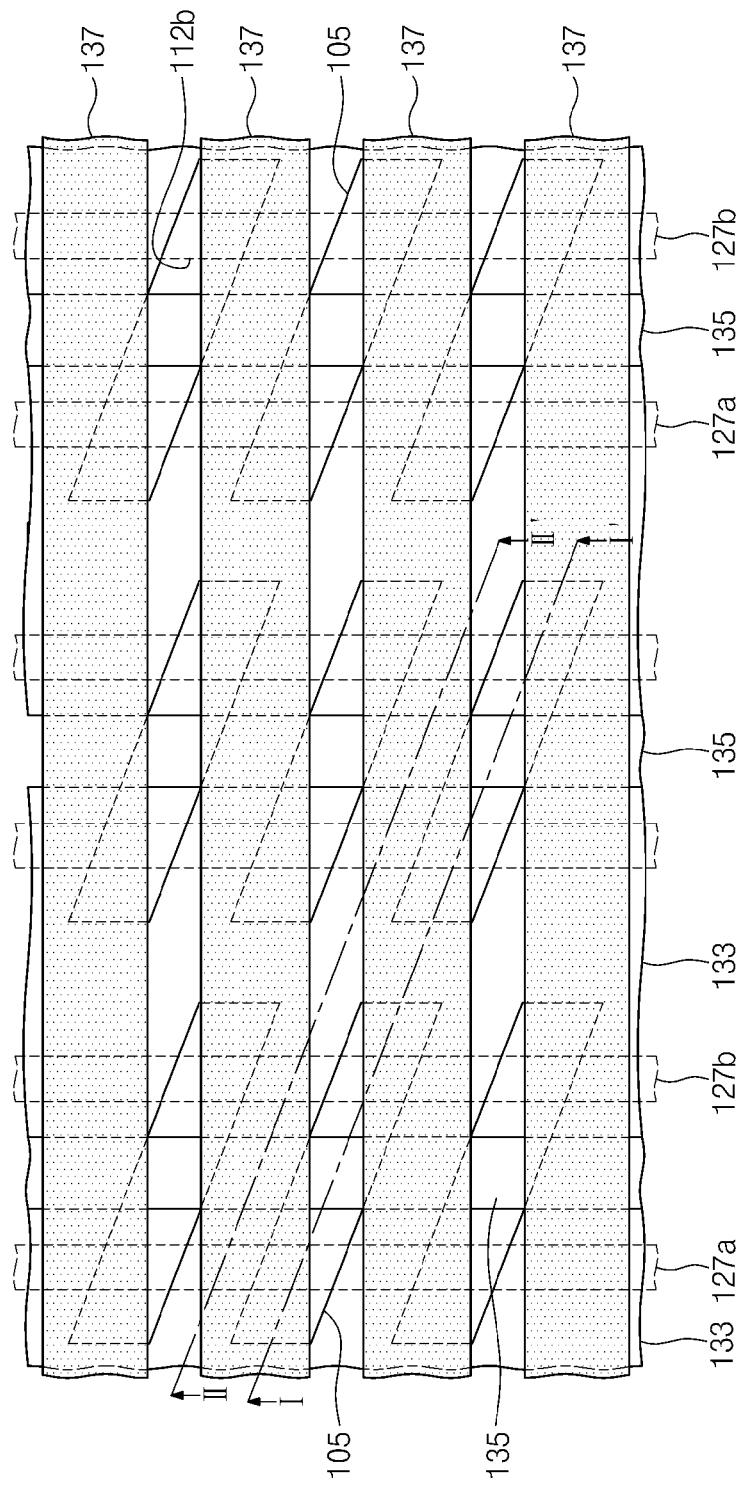
FIG. 25A is a plan view illustrating a mask pattern illustrated in FIG. 14.

A mask pattern 137 may be formed on the substrate 100 having the filling dielectric pattern 135. The mask pattern 137 may include an opening defined by the common pillar 145a illustrated in FIGS. 1 and 2A. A shape of the mask pattern 137 according to an example embodiment is illustrated in FIG. 25A. The mask pattern 137 will be described with reference to FIG. 25A.

FIG. 25A is a plan view illustrating the mask pattern illustrated in FIG. 14.

Referring to FIGS. 14 and 25A, the mask pattern 137 may be formed in a linear shape intersecting the groove 112b. Specifically, a plurality of the mask patterns 137 may extend parallel in a third direction. The third direction is perpendicular to the second direction which is the longitudinal direction of the groove 112b. The mask patterns 137 may be spaced from each other in the second direction. Each mask pattern 137 covers a part of the groove 112b located in the cell device isolation pattern 103a. In this case, a part of the insulating spacer film 133 and a part of the filling dielectric pattern 135, which are formed in another part of the groove 112b located in the cell active portion 105, are exposed.

Alternatively, the mask pattern 137 may be realized with another shape, which will be described with reference to FIG. 25B.

FIG. 25B is a plan view illustrating the mask pattern illustrated in FIG. 14 according to a modified example.

Referring to FIG. 25B, a mask pattern 137a may cover the entire surface of the substrate 100. In this case, the mask pattern 137a may include openings 138 arranged two-dimensionally along the rows and columns. The openings 138 are spaced from each other. The opening 138 may expose a part of the insulating spacer 133 and a part of the filling dielectric pattern 135 in a part of the groove 112b located in the cell active portion 105.

In the following description, a method of using the mask pattern 137 illustrated in FIG. 25A will be described for convenient description.

Figure 15:
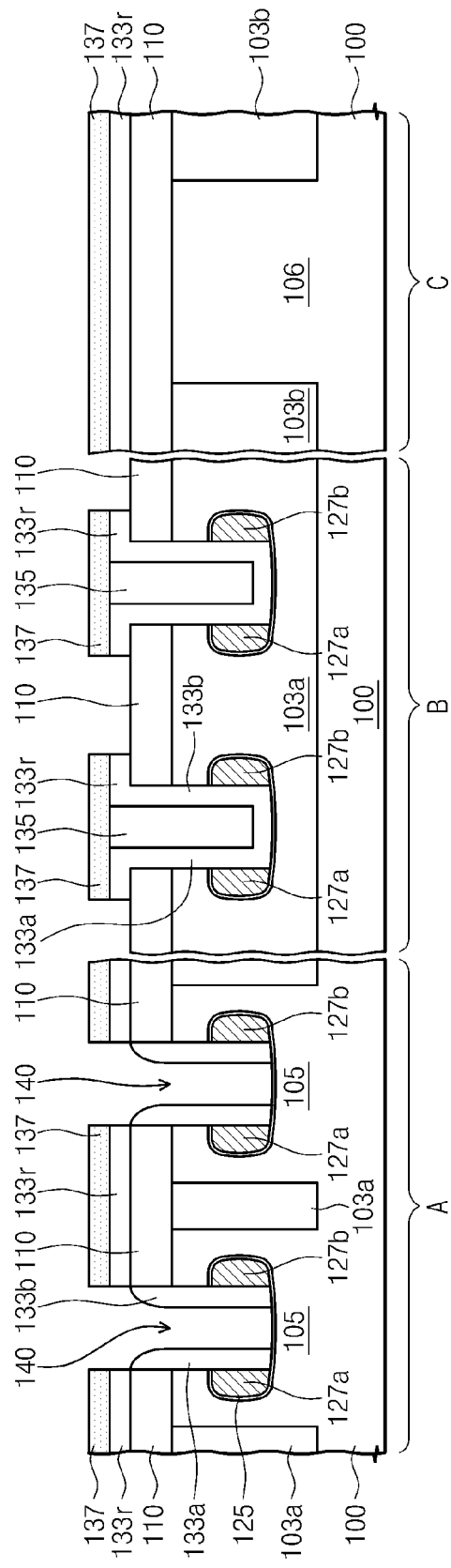

Referring to FIG. 15, the filling dielectric pattern 135 and the insulating spacer film 133 may be sequentially etched by using the mask pattern 137 as an etching mask, such that common contact holes 140 are formed, also a first insulating spacer 133a and a second insulating spacer 133b may be formed on the both inner sidewalls of the groove 112b, respectively. At this time, a portion 133r of the insulating spacer film below the mask pattern 137 and on the hard mask film 110 may remain. Also, a portion of the filling dielectric pattern 135, which is located in the cell device isolation pattern 103a and covered by the mask pattern 137, may remain. A part of the gate dielectric film 125 on the bottom surface of the common contact hole 140 may remain.

Figure 16:
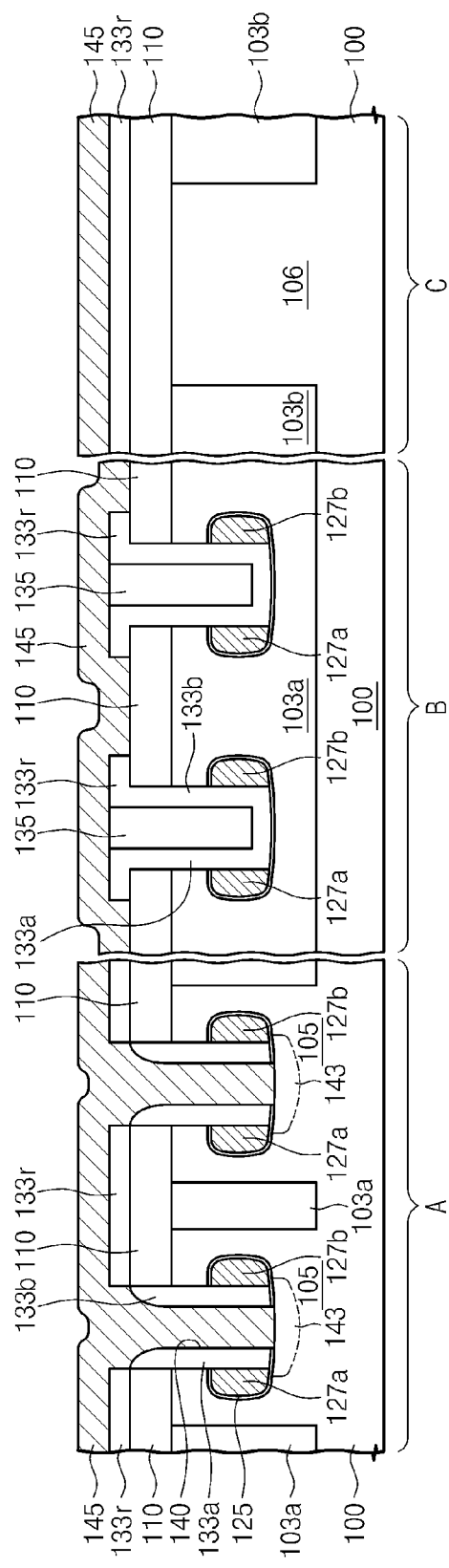

Referring to FIG. 16, the mask pattern 137 may be removed. Dopant ions may be implanted into the cell active portion 105 below the common contact hole 140 to form a common doped region 143. The mask pattern 137 may be removed before the dopant ions are implanted or after the dopant ions are implanted.

The gate dielectric film 125 remaining on the bottom surface of the common contact hole 140 may serve as an ion implanting buffer film for implanting the dopant ions. However, the invention is not limited thereto. The gate dielectric film 125 remaining on the bottom surface of the common contact hole 140 may be removed before the dopant ions are implanted, and a buffer oxide film may be formed before the dopant ions are implanted.

In the following description, the case will be described where the remaining gate dielectric film 125 is used as the ion implanting buffer film.

After the common doped region 143 is formed, the common doped region 143 may be exposed by removing the remaining gate dielectric film 125. Subsequently, a pillar conductive film 145 is aimed on the entire surface of the substrate 100. The common contact hole 140 is filled with the pillar conductive film 145.

Figure 17:
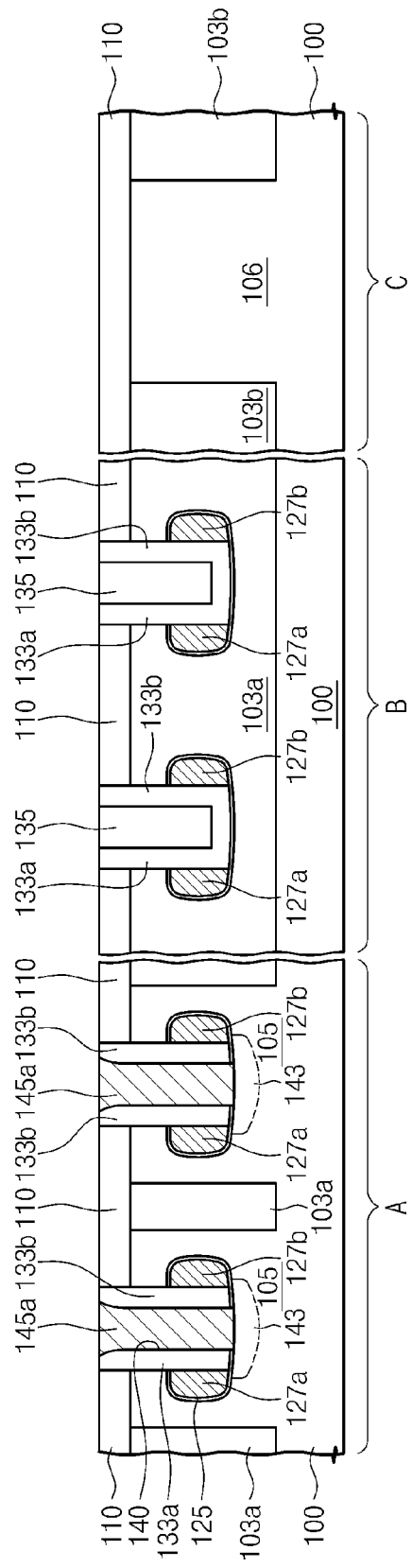

Referring to FIG. 17, the pillar conductive film 145 may be planarized until the hard mask film 110 is exposed, such that a common pillar 145a filling the pillar contact hole 140 is formed. In this case, the remaining portion 133r of the insulating spacer film may be removed together. A portion of the filling dielectric film 135, higher than the upper surface of the hard mask film 110, may be removed together. The pillar conductive film 145 may be planarized by chemical mechanical polishing.

Figure 18:
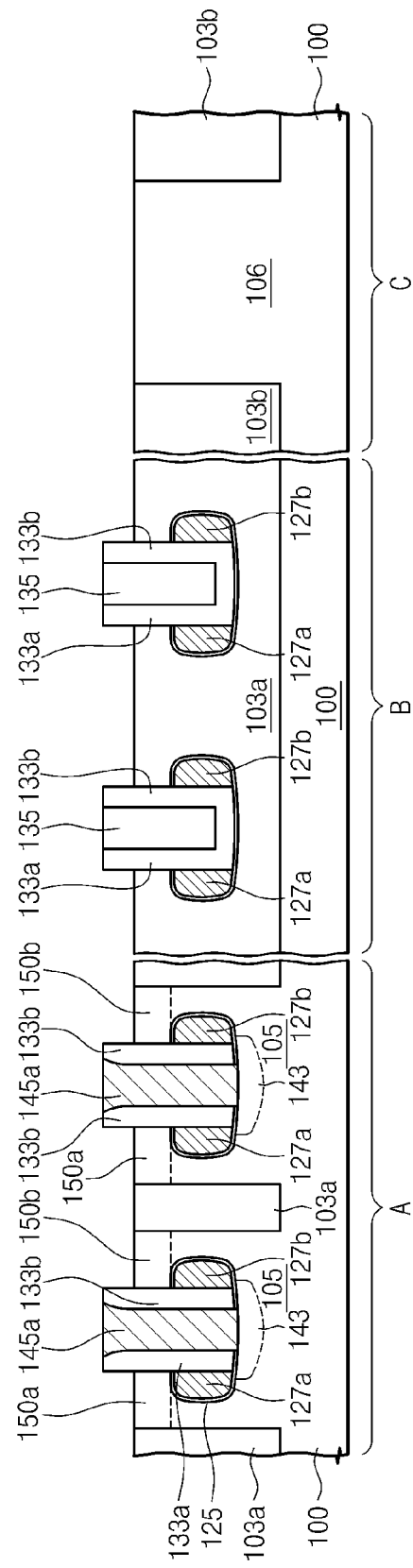

Referring to FIG. 18, the hard mask film 110 may be removed. The common pillar 145a and the insulating spacers 133a and 133b may include a portions protruding more upward (or higher) than the uppermost surface of the cell active portion 105. Dopant ions may be implanted into the cell active portion 105 on the both sides of the groove 112b to form a first doped region 150a and a second doped region 150b.

Figure 19:
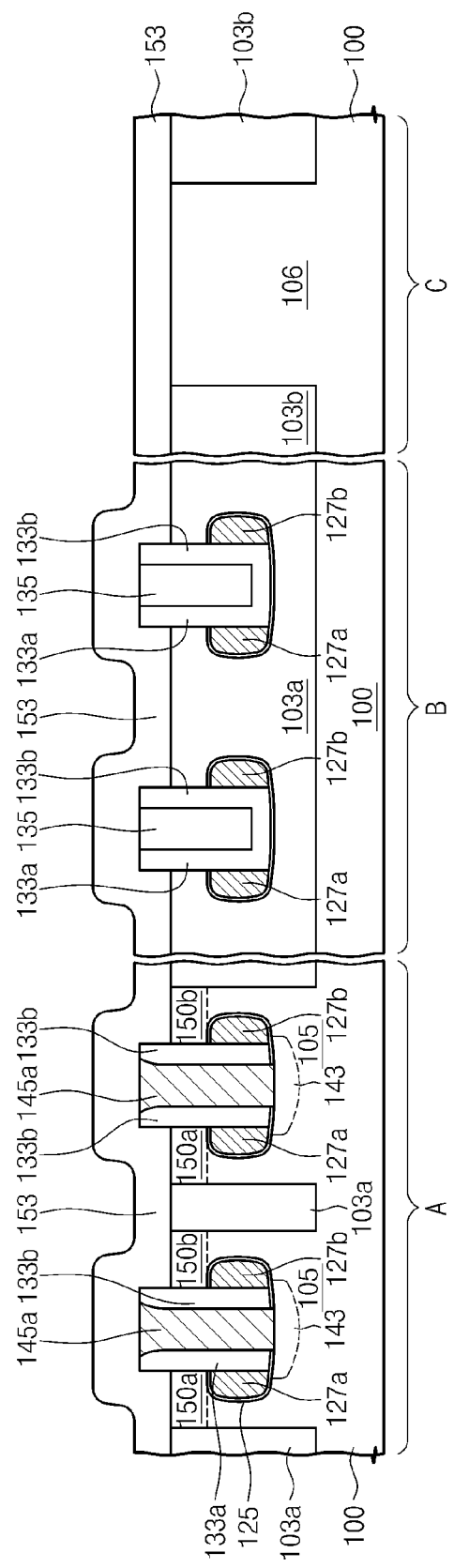
Figure 20:
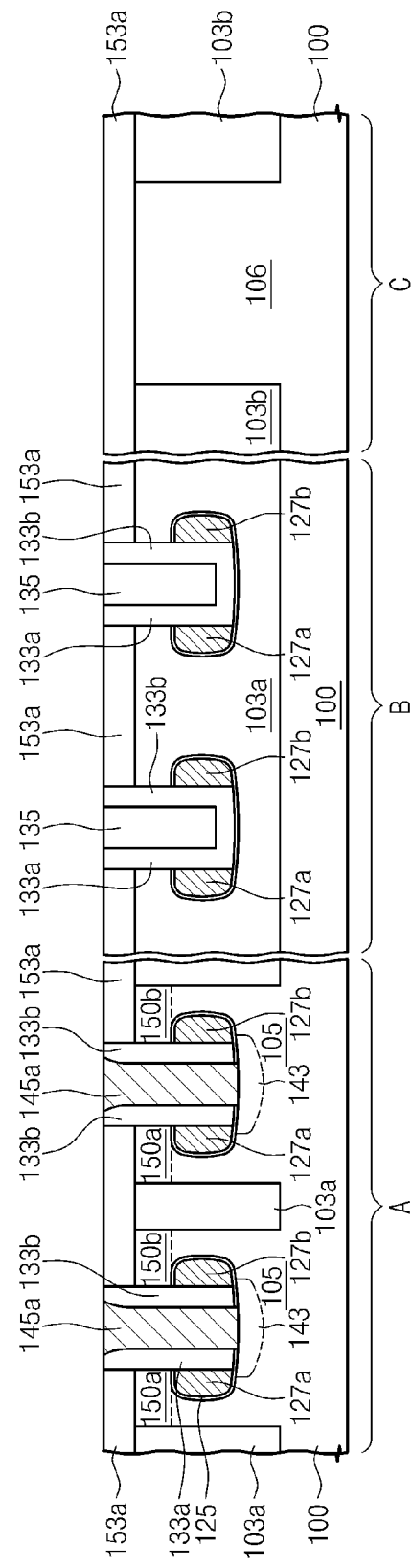

Referring to FIGS. 19 and 20, a capping dielectric film 153 may be formed on the entire surface of the substrate 100 after the first doped region 150a and the second doped region 150b are formed. Subsequently, the capping dielectric film 153 may be planarized until the common pillar 145a and the insulating spacers 133a and 133b are exposed. Therefore, the upper surface of the planarized capping dielectric film 153a may be coplanar with the upper surface of the common pillar 145a and the upper surfaces of the insulating spacers 133a and 133b.

According to an example embodiment of the inventive concepts, when the first doped region 150a and the second doped region 150b are formed by implanting the dopant ions in the state where the hard mask film 110 exists, the removal of the hard mask film 110, the formation of the capping dielectric film 153, and the planarization of the capping dielectric film 153 may be omitted.

Figure 21:
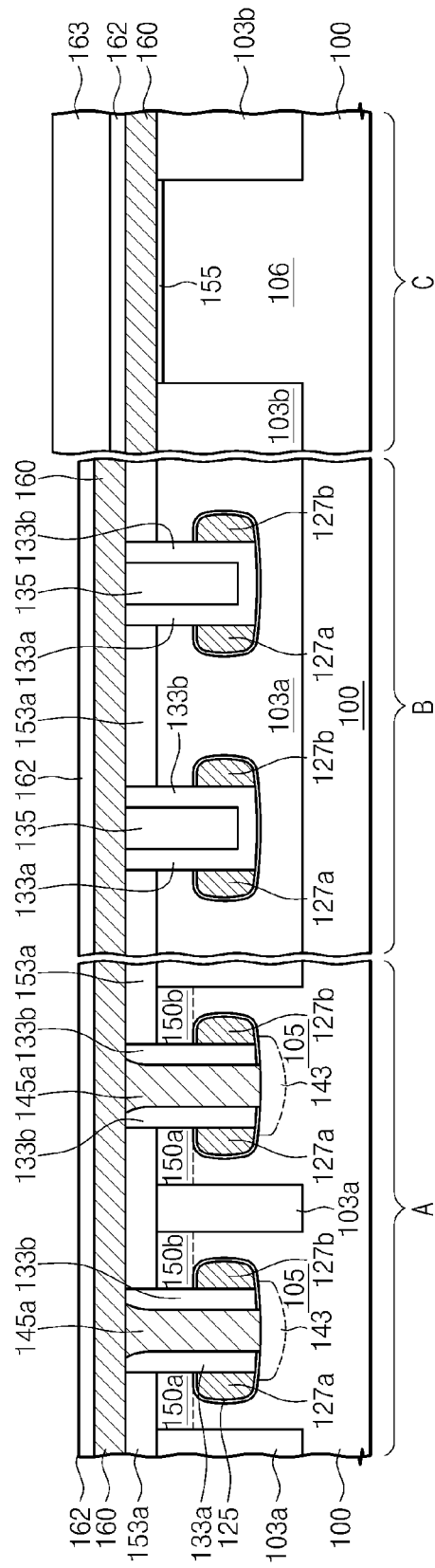

Referring to FIG. 21, the planarized capping dielectric film 153a in the peripheral circuit region may be selectively removed to expose the upper surface of the peripheral active portion 106. In this case, the planarized capping dielectric film 153a in the cell array region remains.

A peripheral gate dielectric film 155 may be formed on the exposed peripheral active portion 106. The peripheral gate dielectric film 155 may be formed by thermal oxidation and/or chemical vapor deposition, for example. A first conductive film 160 is formed on the entire surface of the substrate 100. The first conductive film 160 may be formed of a conductive material having a work function required for a gate of the peripheral field-effect transistor. For example, the first conductive film 160 may be formed of a doped semiconductor material (for example, doped silicon, doped germanium, and/or doped silicon-germanium).

Although not illustrated, the peripheral gate dielectric film 155 may also be formed on the common pillar 145a in forming the peripheral dielectric film 155. According to an example embodiment of the inventive concepts, the peripheral gate dielectric film 155 on the common pillar 145a may be removed before the first conductive film 160 is formed. Alternatively, according to another example embodiment of the inventive concepts, the peripheral gate dielectric film 155 and the first conductive film 160 may be formed sequentially on the common pillar 145a.

An oxide film 162 may be formed on the first conductive film 160. The oxide film 162 may function as a reflection preventing film. The oxide film 162 may protect the first conductive film 160 in the peripheral circuit region. A photoresist pattern 163 may be formed so as to cover the oxide film 162 in the peripheral circuit region. In this case, the oxide film 162 in the cell array region is exposed.

Figure 22:
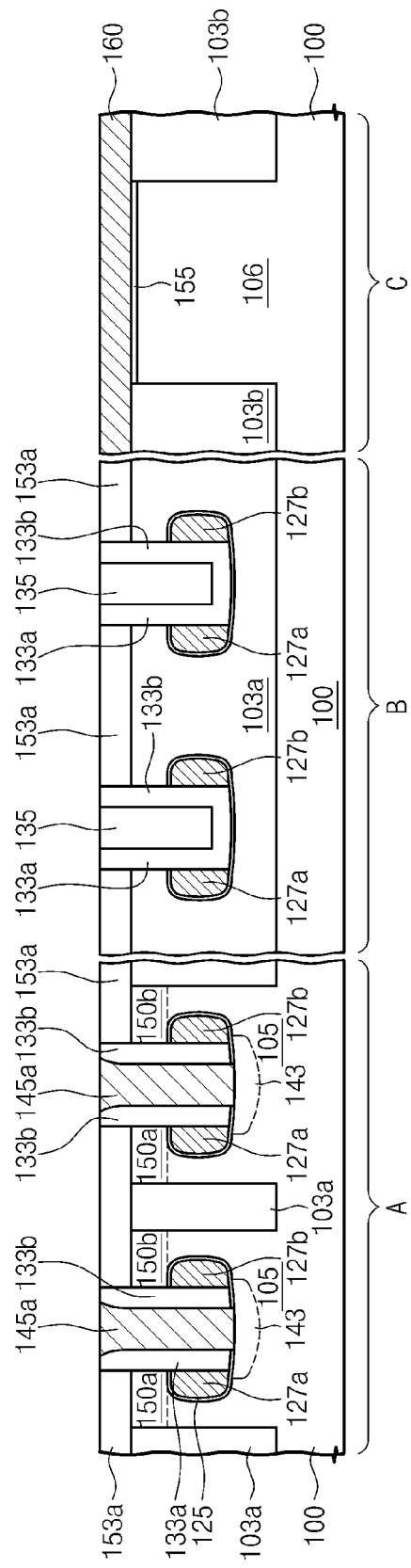

Referring to FIG. 22, by using the photoresist pattern 163, the oxide film 162 and the first conducive film 160 may be removed in the cell array region to expose the upper surface of the common pillar 145a. When the peripheral gate dielectric film 155 and the first conductive film 160 are formed sequentially on the common pillar 145a, as described above, the oxide film 162, the first conductive film 160, and the peripheral gate dielectric film 155 may be removed in the cell array region by using the photoresist pattern 163 as an etching mask to expose the upper surface of the common pillar 145a.

Subsequently, the photoresist pattern 163 is removed and the oxide film 163 in the peripheral circuit region is removed to expose the first conductive film 160 in the peripheral circuit region.

Figure 23:
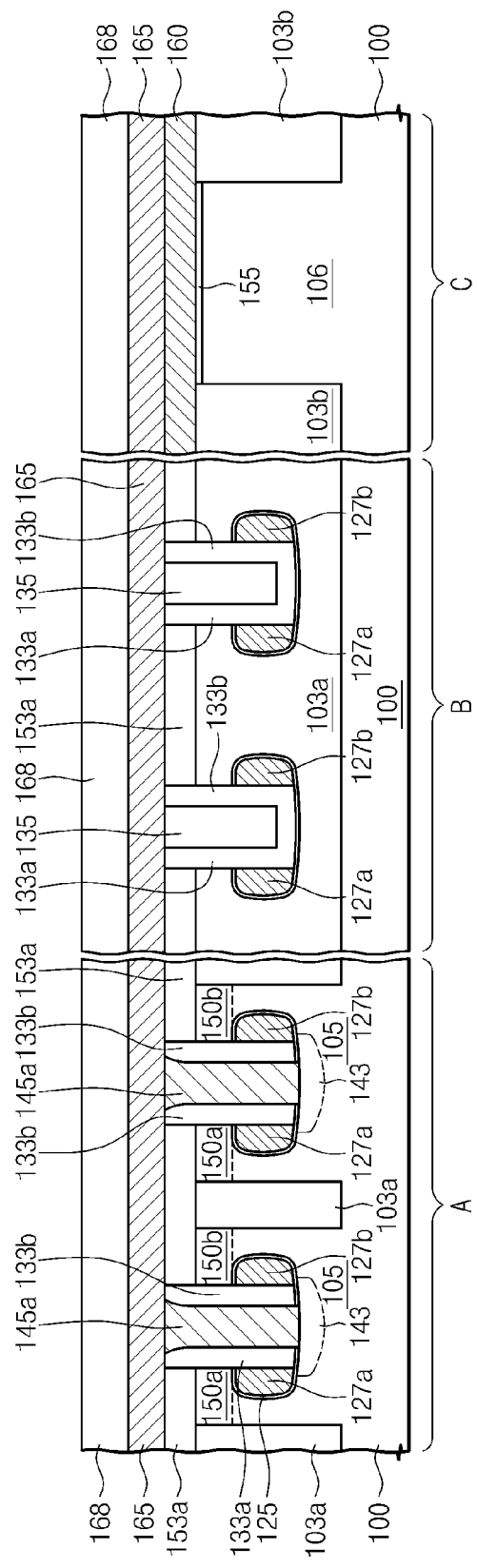

Referring to FIG. 23, a second conductive film 165 is formed on the entire surface of the substrate 100. The second conductive film 165 in the cell array region comes into contact with the upper surface of the exposed common pillar 145a. The second conductive film 165 in the peripheral circuit region comes into contact with the upper surface of the first conductive film 160.

The second conductive film 165 may be formed of a conductive material having resistivity lower than that of the first conductive film 160. For example, the second conductive film 165 may include at least one of a metal (for example, tungsten, titanium, or tantalum), a conductive metal nitride (for example, titanium nitride or tantalum nitride), or a metal-semiconductor compound (for example, tungsten silicide, cobalt silicide, or titanium silicide). A capping mask film 168 may be formed on the second conductive film 165. The capping mask film 168 may be formed of, for example, an oxide film, a nitride film, and/or an oxynitride.

Figure 24:
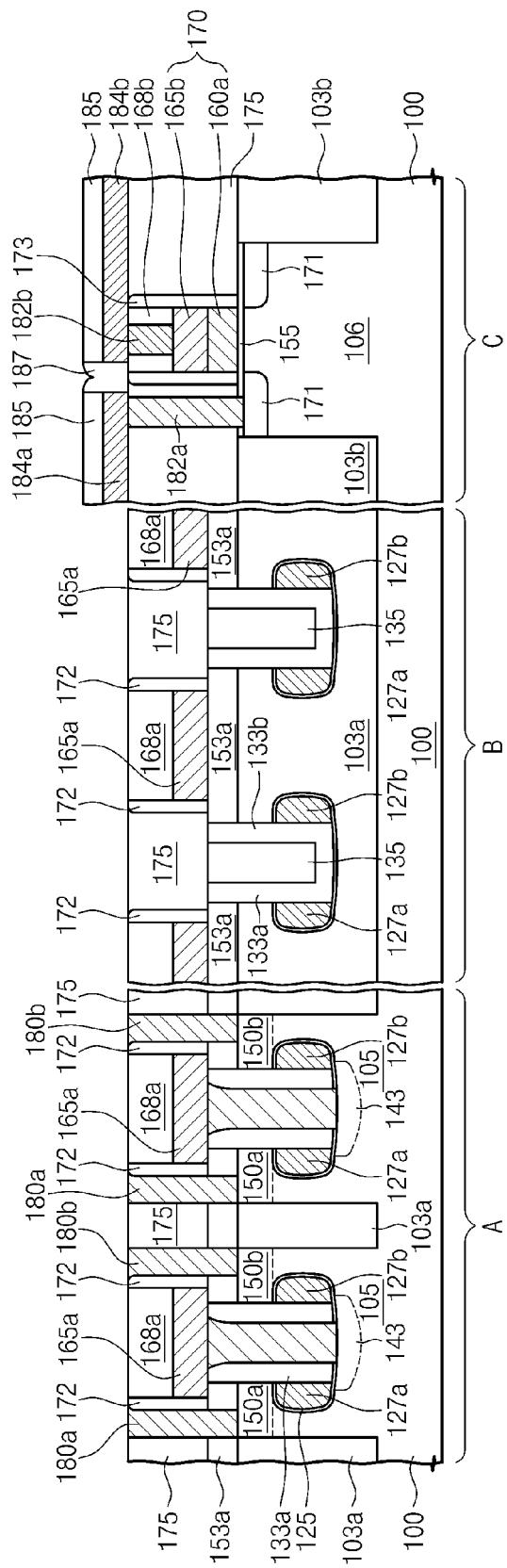

Referring to FIG. 24, the capping mask film 168 and the second conducive film 165 in the cell array region are sequentially patterned to form the common wiring 165a and the cell capping mask pattern 168 sequentially laminated. The capping mask film 168, the second conductive film 165, and the first conductive film 160 in the peripheral circuit region are sequentially patterned to form the peripheral gate 170 and the peripheral capping mask pattern 168b sequentially laminated. The peripheral gate 170 includes the lower gate 160a and the upper gate 165b sequentially laminated. The common wiring 165a and the upper gate 165b are fog lied in parts of the second conductive film 165. Therefore, the common wiring 165a and the upper gate 165b are formed of the same material. The common wiring 165a and the peripheral gate 170 may be formed simultaneously.

The peripheral source/drain 171 is formed by implanting the dopant ions into the peripheral active portion 106 on the both sides of the peripheral gate 170. By forming a spacer film conformally on the entire surface of the substrate 100 and subjecting the spacer film to anisotropic etching, the sidewall spacers 172 are formed on the both sidewalls of the cell capping mask pattern 168a and the common wiring 165a and the peripheral gage spacers 173 are formed on the both sidewalls of the peripheral gate 170 and the peripheral capping mask pattern 168b. Therefore, the sidewall spacers 172 and the peripheral gate spacers 173 may be formed simultaneously and formed of the same material.

A inter-layer dielectric film 175 is formed on the entire surface of the substrate 100. The inter-layer dielectric film 175 may be planarized until the upper surfaces of the capping mask patterns 168a and 168b are exposed.

A first contact plug 180a and a second contact plug 180b are formed so as to penetrate the planarized inter-layer dielectric film 175 and the capping dielectric film 153a in the cell array region and to contact with the first doped region 150a and the second doped region 150b, respectively. The peripheral contact plug 182a may be formed so as to penetrate the planarized inter-layer dielectric film 175 in the peripheral circuit region and to come into contact with the peripheral source/drain 171. The peripheral gate contact plug 182b may be formed so as to penetrate the peripheral capping mask pattern 168b. The first contact plug 180a, the second contact plug 180b, the peripheral contact plug 182a, and the peripheral gate contact plug 182b may be formed simultaneously and formed of the same material to each other.

The first peripheral wiring 184a and the second peripheral wiring 184b may be formed on the inter-layer dielectric film 175 in the peripheral circuit region so as to come into contact with the peripheral contact plug 182a and the peripheral gate contact plug 182b, respectively. The peripheral capping pattern 185 may be formed on the first peripheral wiring 184a and the second peripheral wiring 184b. The peripheral sidewall spacer 187 may be formed on the sidewalls of the first peripheral wiring 184a, the second peripheral wiring 184b, and the peripheral capping pattern 185.

The first data storing element DS1 and the second data storing element DS2 (illustrated in FIGS. 1 and 2A) may be formed so as to come into contact with the first contact plug 180a and the second contact plug 180b, respectively. In this way, it is possible to realize the semiconductor memory device illustrated in FIGS. 1 and 2A. The first and second data storing elements may be formed by the capacitors illustrated in FIG. 3. In this way, it is possible to realize the semiconductor memory device illustrated in FIG. 3. Alternatively, the first and second data storing elements may include the variable resistors illustrated in FIGS. 4A and 4B. In this way, it is possible to realize the semiconductor memory device described with reference to FIGS. 4A and 4B.

According to an example embodiment of the inventive concepts, the groove 112' illustrated in FIG. 2C may be formed by performing the etching by a sufficient depth by the first anisotropic etching process described with reference to FIG. 9 in the method of forming the above-described semiconductor memory device. In this way, it is possible to realize the semiconductor memory device illustrated in FIG. 2C. The method of forming the semiconductor memory device illustrated in FIG. 2C may not require formation of the etching protection spacer 121, the second anisotropic etching process, and the recessing process described with reference to FIGS. 9, 10, and 11.

The method of forming the semiconductor memory device illustrated in FIGS. 6A and 6B may be similar to the method described with reference to FIGS. 8 through 25. However, before the capping dielectric film 153a is removed in the peripheral circuit region, as described with reference to FIG. 20, the method may further include forming the lower inter-layer dielectric film 248 and forming the conductive pad 250 in the lower inter-layer dielectric film 248. The subsequent process may be performed in the same way described with reference to FIGS. 20 through 24.

The method of forming the semiconductor memory device illustrated in FIGS. 7A and 7B may be similar to the method described with reference to FIGS. 8 through 25. In the features, the method of forming the groove 112b' in FIGS. 7A and 7B has been described with reference to FIG. 11. The common doped region 143' may be formed before the buried gates 127a and 127b are formed. For example, after the groove 112b' is formed and before the undercut regions Uc1 and Uc2 are filled, the common doped region 143' illustrated in FIG. 7B may be formed by performing inclined implanting with dopant ions.

The semiconductor memory devices according to the above-described example embodiments may be realized in various forms of a semiconductor package. For example, the semiconductor memory devices according to the inventive concepts may be packaged in a package way such as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin, small outline (TSOP), thin quad flat pack (TQFP), system in package (SIP), multi chip package (MCP), wafer-level fabricated package (WFP), or wafer-level processed stack package (WSP).

Figure 26:
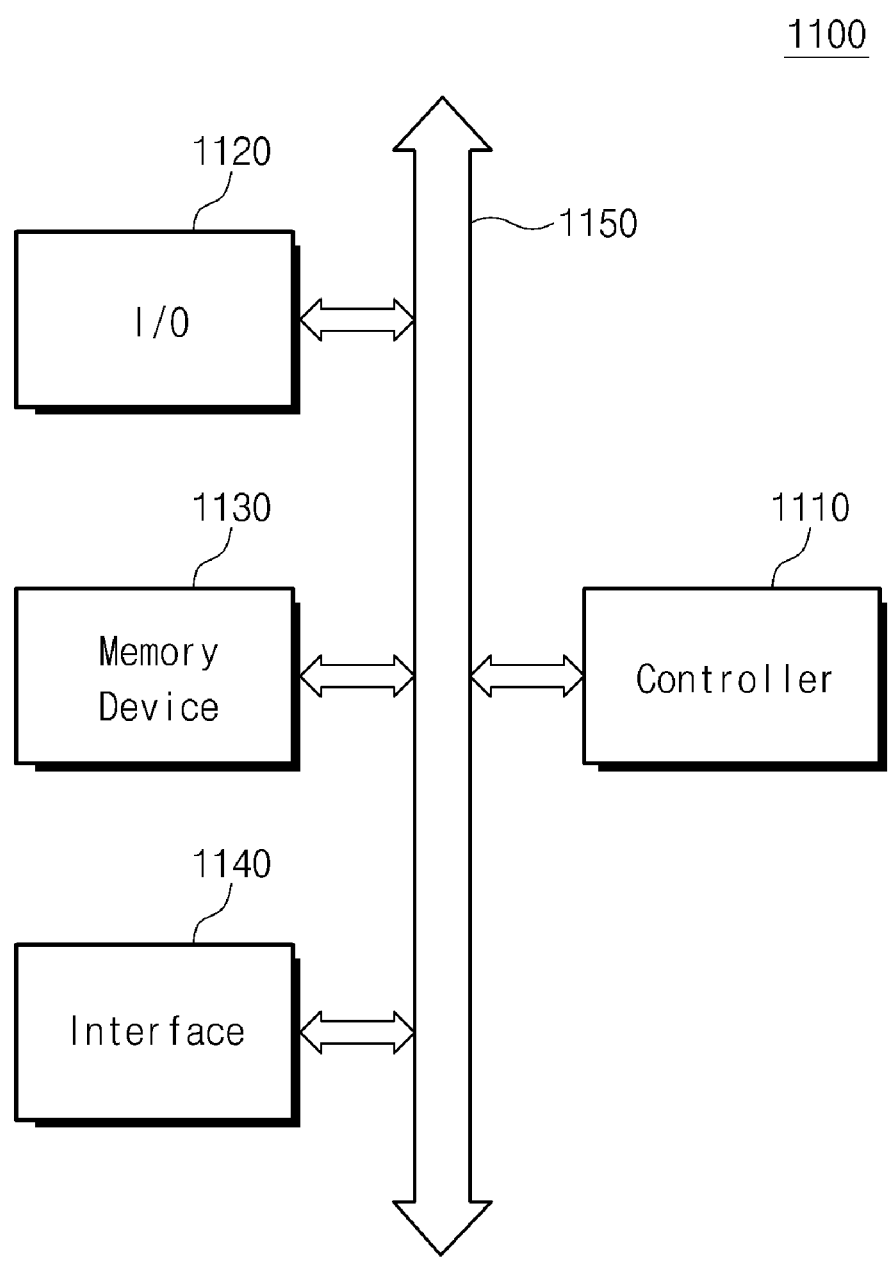
FIG. 26 is a block diagram schematically illustrating an example of an electronic system including the semiconductor memory device based on example embodiment of the inventive concepts.

FIG. 26 is a block diagram schematically illustrating an example of an electronic system including the semiconductor memory device based on the technical spirit of the inventive concepts.

Referring to FIG. 26, the electronic system 1100 according to an yet another embodiment of the inventive concepts includes a controller 1110, an input/output (I/O) device 1120, a memory device 1130, an interface 1140, and a bus 1150. The controller 1110, the input/output (I/O) device 1120, the memory device 1130, and/or the interface 1140 may be connected to each other via the bus 1150. The bus 1150 corresponds to a path through which data are transferred and received.

The controller 1110 includes at least one of a microprocessor, a digital signal processor, a microcontroller, and logic units capable of carrying out a similar function. The I/O device 1120 may includes a keypad, a keyboard, a display device, or the like. The memory device 1130 may store data and/or commands. The memory device 1130 may include at least one of the semiconductor memory devices described with reference to FIGS. 1 through 7. The memory device 1130 may further include a flash memory device. The interface 1140 may be realized in a wired or wireless form. For example, the interface 1140 may include an antenna, a wired/wireless transceiver, or the like. Although not illustrated, the electronic system 1100 may further include an operational memory device for improving the operation of the controller 1110. The operational memory device may include an SRAM device and/or the DRAM device according to an example embodiment of the inventive concepts.

The electronic system 1100 is applicable to a PDA (Personal Digital Assistant), a portable computer, a web tablet, a wireless phone, a mobile phone, a digital music player, a memory card, or any electronic device capable of transmitting and/or receiving information in a wireless environment.

Figure 27:
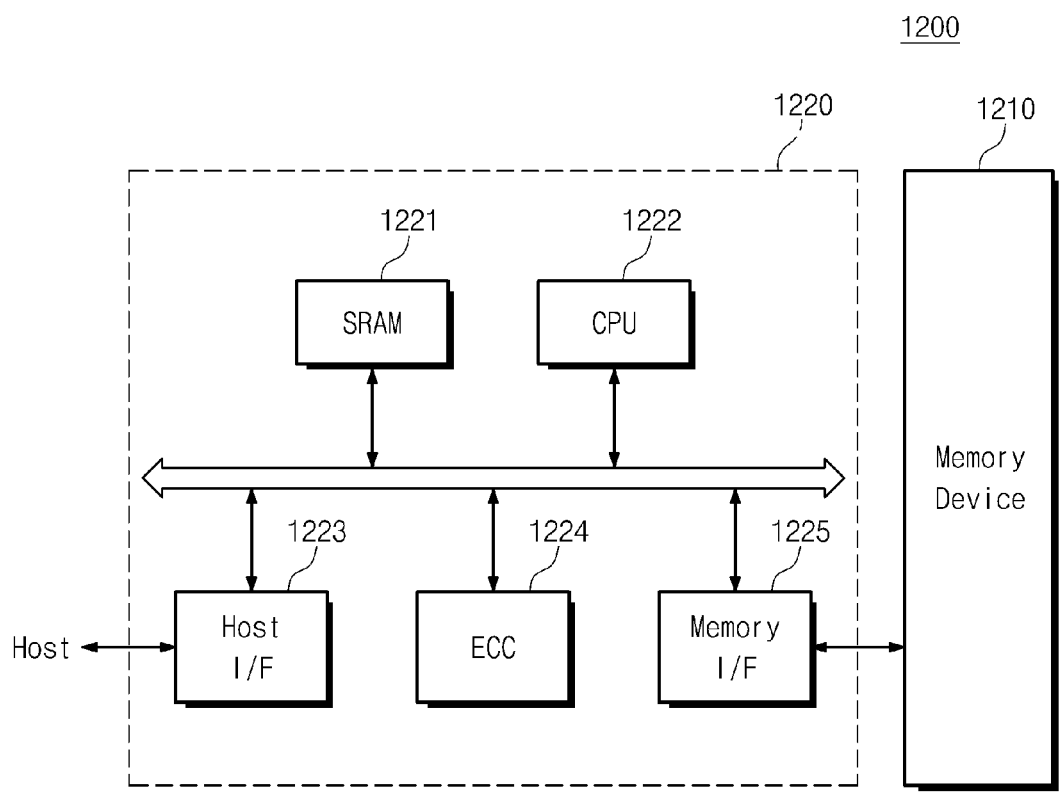
FIG. 27 is a block diagram schematically illustrating an example of a memory card including the semiconductor memory device based on the example embodiment of the inventive concepts.

FIG. 27 is a block diagram schematically illustrating an example of a memory card including the semiconductor memory device based on the technical spirit of the inventive concepts.

Referring to FIG. 27, a memory card 1200 according to an embodiment of the inventive concept includes a memory device 1210. The memory device 1210 may include a non-volatile memory device according to an example embodiment of the inventive concepts. The memory device 1210 may further include a DRAM device according to an example embodiment of the inventive concepts. Moreover, the memory device 1210 may further include a flash memory device or the like. The memory card 1200 may include a memory controller 1220 generally controlling data exchange between a host and the memory device 1210.

The memory controller 1220 may include a processing unit 1222 generally controlling the operation of the memory card. The memory controller 1220 may includes an SRAM 1221 used as an operational memory of the processing unit 1222. The memory controller 1220 may further include a host interface 1223 and a memory interface 1225. The host interface 1223 may has a protocol exchanging data between the memory card 1200 and the host. The memory interface 1225 may connect the memory controller 1220 to the memory device 1210. The memory controller 1220 may further include an error correction block (Ecc) 1224. The error correction block 1224 may detect and correct errors of the data read from the memory device 1210. Although not illustrated, the memory card 1200 may further include a ROM device storing code data for interfacing with the host. The memory card 1200 may be used as a portable data storing card. Alternatively, the memory card 1200 may be realized as a solid state disk (SSD) replacing a hard disk drive of a computer system.

According to the example embodiments of the inventive concepts, the first and second buried gates controlled independently are disposed in the groove. With such a configuration, it is possible to minimize the occupied area of the first and second memory cells each including the first and second buried gates. Accordingly, it is possible to realize the semiconductor memory device highly-integrated and having good reliability.

Although the present invention has been described in connection with the example embodiments of the present invention illustrated in the accompanying drawings, it is not limited thereto, but may be modified in other specific fog within departing from the scope and essential features of the inventive concept. Therefore, it should be understood that the above-disclosed subject matter is to be considered illustrative and not restrictive.

What is claimed is:

1. A semiconductor memory device, comprising:
a device isolation pattern formed in a substrate to define an active portion extending in a first direction;

first and second buried gates respectively disposed on first and second inner sidewalls of a groove formed in the active portion and the device isolation pattern, the groove extending in a second direction non-parallel to the first direction, and the first and second buried gates controlled independently from each other;

gate dielectric films respectively interposed between the first buried gate and the first inner sidewall of the groove and between the second buried gate and the second inner sidewall of the groove;

first and second doped regions respectively formed in upper portions of the active portion on both sides of the groove; and a common doped region formed in the active portion below a bottom surface of the groove.

2. The semiconductor memory device of claim 1, wherein the first buried gate is disposed on a lower sidewall of the first inner sidewall and the second buried gate is disposed on a lower sidewall of the second inner sidewall.

3. The semiconductor memory device of claim 2, wherein
the lower sidewall of the first inner sidewall is recessed laterally with respect to an upper sidewall of the first inner sidewall to define a first undercut region,
the lower sidewall of the second inner sidewall is recessed laterally with respect to an upper sidewall of the second inner sidewall to define a second undercut region,
the first buried gate is disposed in the first undercut region, and
the second buried gate is disposed in the second undercut region.

4. The semiconductor memory device of claim 3, wherein
the lower sidewall of the first inner sidewall includes a first active lower sidewall formed by the active portion and a first non-active lower sidewall formed by the device isolation pattern,
the first non-active lower sidewall is recessed more laterally than the first active lower sidewall, such that a first channel region controlled by the first buried gate includes a first portion extending in the first direction and a second portion extending in the second direction,
the lower sidewall of the second inner sidewall includes a second active lower sidewall formed by the active portion and a second non-active lower sidewall formed by the device isolation pattern, and
the second non-active lower sidewall is recessed more laterally than the second active lower sidewall, such that a second channel region controlled by the second buried gate includes a first portion extending in the first direction and a second portion extending in the second direction.

5. The semiconductor memory device of claim 3, wherein the first buried gate has a sidewall that is self-aligned on the upper sidewall of the first inner sidewall.

6. The semiconductor memory device of claim 3, wherein
the first buried gate has first and second sidewalls opposite to each other, the first sidewall of the first buried gate is adjacent to the lower sidewall of the first inner sidewall, and the second sidewall of the first buried gate is recessed more laterally than the upper sidewall of the first inner sidewall, and
the second buried gate has first and second sidewalls opposite to each other, the first sidewall of the second buried gate is adjacent to the lower sidewall of the second inner sidewall, and the second sidewall of the second buried gate is recessed more laterally than the upper sidewall of the second inner sidewall.

7. The semiconductor memory device of claim 1, further comprising:
a first data storing element electrically connected to the first doped region;
a second data storing element electrically connected to the second doped region; and
a common wiring electrically connected to the common doped region.

8. The semiconductor memory device of claim 7, further comprising:
a common pillar disposed in the groove and connected to the common doped region;
a first insulating spacer interposed between the common pillar and the first buried gate; and
a second insulating spacer interposed between the common pillar and the second buried gate,
wherein the common wiring is electrically connected to an upper surface of the common pillar.

9. The semiconductor memory device of claim 7, wherein
the first data storing element is a first capacitor including a first storage electrode electrically connected to the first doped region,
the second data storing element is a second capacitor including a second storage electrode electrically connected to the second doped region, and
the common wiring is a bit line crossing over the first and second buried gates.

10. The semiconductor memory device of claim 7, wherein
the first data storing element includes a first variable resistor changeable to a plurality of stable states with resistivities different from each other, and
the second data storing element includes a second variable resistor changeable to a plurality of stable states with resistivities different from each other.

11. The semiconductor memory device of claim 1, wherein the second direction is not perpendicular to the first direction.

12. The semiconductor memory device of claim 1, wherein the second direction is perpendicular to the first direction.

13. The semiconductor memory device of claim 1, wherein the substrate includes a cell array region and a peripheral circuit region, and the active portion and the first and second buried gates are disposed in the cell array region,
the semiconductor memory device further comprising,
a peripheral device isolation pattern disposed in the substrate in the peripheral circuit region to define a peripheral active portion;
a peripheral gate crossing over the peripheral active portion; and
a peripheral gate dielectric film interposed between an upper surface of the peripheral active portion and the peripheral gate, and
the common wiring is formed of the same material as an upper portion of the peripheral gate.

* * * * *